(12) United States Patent
Kawashima et al.

(10) Patent No.: US 11,984,064 B2
(45) Date of Patent: May 14, 2024

(54) DISPLAY APPARATUS, ITS OPERATING METHOD, AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Koji Kusunoki, Kanagawa (JP); Kazunori Watanabe, Tokyo (JP); Satoshi Yoshimoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/018,051

(22) PCT Filed: Jul. 30, 2021

(86) PCT No.: PCT/IB2021/056949
§ 371 (c)(1),
(2) Date: Jan. 26, 2023

(87) PCT Pub. No.: WO2022/034424
PCT Pub. Date: Feb. 17, 2022

(65) Prior Publication Data
US 2023/0326396 A1    Oct. 12, 2023

(30) Foreign Application Priority Data
Aug. 12, 2020    (JP) ................. 2020-136207

(51) Int. Cl.
*G09G 3/32*    (2016.01)
*H10K 59/131*    (2023.01)

(52) U.S. Cl.
CPC ............. *G09G 3/32* (2013.01); *H10K 59/131* (2023.02); *G09G 2300/0819* (2013.01);
(Continued)

(58) Field of Classification Search
CPC ............. G09G 3/32; G09G 2300/0819; G09G 2300/0842; G09G 2310/02; G09G 2310/08; G09G 2330/021; H10K 59/131
See application file for complete search history.

(56) References Cited

U.S. PATENT DOCUMENTS

| 5,828,429 A | 10/1998 | Takemura |
| 7,187,351 B2 | 3/2007 | Kwon |

(Continued)

FOREIGN PATENT DOCUMENTS

| CN | 001417767 A | 5/2003 |
| CN | 001510652 A | 7/2004 |

(Continued)

OTHER PUBLICATIONS

International Search Report (Application No. PCT/IB2021/056949) dated Oct. 12, 2021.

(Continued)

*Primary Examiner* — Abhishek Sarma
(74) *Attorney, Agent, or Firm* — NIXON PEABODY LLP; Jeffrey L. Costellia

(57) ABSTRACT

A display apparatus having a wide range of threshold voltage compensation function is provided. In the display apparatus, a p-channel transistor is used as a driving transistor of the light-emitting device. Discharging is performed through a source-drain path while constant voltage is supplied to a gate so that Vth is extracted between the gate and the source. In addition, when a drain potential is set to the sum of forward voltage and a cathode potential of the light-emitting device or a potential sufficiently lower than the sum, it is possible to continue the discharging even when Vth is positive voltage. That is, compensation can be performed even in the case where Vth variation occurs from positive voltage to negative voltage.

15 Claims, 22 Drawing Sheets

(52) U.S. Cl.
CPC . *G09G 2300/0842* (2013.01); *G09G 2310/02* (2013.01); *G09G 2310/08* (2013.01); *G09G 2330/021* (2013.01)

(56) References Cited

U.S. PATENT DOCUMENTS

| | | | |
|---|---|---|---|
| 7,224,334 B2 | 5/2007 | Choi et al. | |
| 7,429,985 B2 | 9/2008 | Kimura et al. | |
| 7,595,775 B2 | 9/2009 | Osame et al. | |
| 7,674,650 B2 | 3/2010 | Akimoto et al. | |
| 8,207,756 B2 | 6/2012 | Shionoiri et al. | |
| 8,354,674 B2 | 1/2013 | Kimura | |
| 8,358,299 B2 | 1/2013 | Chaji et al. | |
| 8,455,876 B2 | 6/2013 | Choi et al. | |
| 8,614,652 B2 | 12/2013 | Nathan et al. | |
| 8,633,872 B2 | 1/2014 | Osame | |
| 8,710,505 B2 | 4/2014 | Kimura | |
| 8,710,749 B2 | 4/2014 | Kimura | |
| 8,878,589 B2 | 11/2014 | Kimura | |
| 8,896,042 B2 | 11/2014 | Yamazaki et al. | |
| 8,957,889 B2 | 2/2015 | Miyake | |
| 9,013,457 B2 | 4/2015 | Kimura | |
| 9,030,105 B2 | 5/2015 | Koyama | |
| 9,257,071 B2 | 2/2016 | Kimura | |
| 9,280,931 B2 | 3/2016 | Kimura | |
| 9,370,075 B2 | 6/2016 | Chaji et al. | |
| 9,520,411 B2 | 12/2016 | Takahashi et al. | |
| 9,543,370 B2 | 1/2017 | Tsai et al. | |
| 9,666,655 B2 | 5/2017 | Miyake | |
| 9,818,344 B2 | 11/2017 | Lin et al. | |
| 9,818,765 B2 | 11/2017 | Osawa et al. | |
| 9,824,632 B2 | 11/2017 | Chaji et al. | |
| 9,867,257 B2 | 1/2018 | Nathan et al. | |
| 9,877,371 B2 | 1/2018 | Nathan et al. | |
| 9,881,587 B2 | 1/2018 | Chaji et al. | |
| 10,007,161 B2 | 6/2018 | Miyake | |
| 10,008,149 B2 | 6/2018 | Inoue et al. | |
| 10,032,841 B2 | 7/2018 | Tsai et al. | |
| 10,043,794 B2 | 8/2018 | Kimura | |
| 10,134,335 B2 | 11/2018 | Chaji et al. | |
| 10,290,284 B2 | 5/2019 | Chaji et al. | |
| 10,483,293 B2 | 11/2019 | Miyake | |
| 10,490,553 B2 | 11/2019 | Yamazaki | |
| 10,529,286 B2 | 1/2020 | Koyama | |
| 10,555,398 B2 | 2/2020 | Nathan et al. | |
| 10,978,022 B2 | 4/2021 | Chaji et al. | |
| 11,030,949 B2 | 6/2021 | Chaji et al. | |
| 11,081,053 B2 | 8/2021 | Jin et al. | |
| 11,417,273 B2 | 8/2022 | Toyotaka et al. | |
| 2003/0103022 A1 | 6/2003 | Noguchi et al. | |
| 2004/0056828 A1 | 3/2004 | Choi et al. | |
| 2004/0196223 A1 | 10/2004 | Kwon | |
| 2008/0106208 A1 | 5/2008 | Choi et al. | |
| 2009/0160741 A1 | 6/2009 | Inoue et al. | |
| 2010/0039458 A1 | 2/2010 | Nathan et al. | |
| 2010/0207920 A1 | 8/2010 | Chaji et al. | |
| 2011/0089417 A1 | 4/2011 | Yamazaki et al. | |
| 2015/0325172 A1 | 11/2015 | Koyama | |
| 2016/0133190 A1* | 5/2016 | Kim | G09G 3/2011 345/80 |
| 2018/0114487 A1 | 4/2018 | He et al. | |
| 2020/0243012 A1 | 7/2020 | Jin et al. | |
| 2021/0280153 A1 | 9/2021 | Chaji et al. | |
| 2022/0246694 A1 | 8/2022 | Watanabe et al. | |
| 2022/0336570 A1 | 10/2022 | Nakagawa et al. | |
| 2022/0384526 A1 | 12/2022 | Yamazaki et al. | |

FOREIGN PATENT DOCUMENTS

| | | |
|---|---|---|
| CN | 001534579 A | 10/2004 |
| CN | 102057418 A | 5/2011 |
| CN | 102246220 A | 11/2011 |
| CN | 105609050 A | 5/2016 |
| CN | 109493806 A | 3/2019 |
| EP | 1465141 A | 10/2004 |
| EP | 2945147 A | 11/2015 |
| EP | 3404646 A | 11/2018 |
| EP | 3686875 A | 7/2020 |
| JP | 2003-208127 A | 7/2003 |
| JP | 2004-118196 A | 4/2004 |
| JP | 2004-310014 A | 11/2004 |
| JP | 2007-096055 A | 4/2007 |
| JP | 2007-123861 A | 5/2007 |
| JP | 2011-520139 | 7/2011 |
| JP | 2012-511183 | 5/2012 |
| JP | 2015-228023 A | 12/2015 |
| JP | 2020-118973 A | 8/2020 |
| KR | 2003-0038522 A | 5/2003 |
| KR | 2004-0029242 A | 4/2004 |
| KR | 10-0497246 | 6/2005 |
| KR | 2010-0134125 A | 12/2010 |
| KR | 2020-0093458 A | 8/2020 |
| WO | WO-2009/127065 | 10/2009 |
| WO | WO-2010/066030 | 6/2010 |
| WO | WO-2012/164474 | 12/2012 |
| WO | WO-2017/095537 | 6/2017 |
| WO | WO-2017/117939 | 7/2017 |
| WO | WO-2022/009017 | 1/2022 |

OTHER PUBLICATIONS

Written Opinion (Application No. PCT/IB2021/056949) dated Oct. 12, 2021.

* cited by examiner

DISPLAY APPARATUS, ITS OPERATING METHOD, AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor apparatus, a display apparatus, a liquid crystal display apparatus, a light-emitting device, a lighting device, a power storage device, a memory device, an imaging device, an operation method thereof, and a manufacturing method thereof.

Note that in this specification and the like, a semiconductor apparatus generally means an apparatus that can function by utilizing semiconductor characteristics. A transistor and a semiconductor circuit are embodiments of semiconductor apparatuses. In addition, in some cases, a memory device, a display apparatus, an imaging device, or an electronic device includes a semiconductor apparatus.

BACKGROUND ART

A technique for forming transistors using a metal oxide formed over a substrate has been attracting attention. For example, Patent Document 1 and Patent Document 2 each disclose a technique in which a transistor formed using zinc oxide or an In—Ga—Zn-based oxide is used as a switching element or the like of a pixel in a display apparatus.

REFERENCE

Patent Document

[Patent Document 1] Japanese Published Patent Application No. 2007-123861
[Patent Document 2] Japanese Published Patent Application No. 2007-96055

SUMMARY OF THE INVENTION

Problems to be Solved by the Invention

In a display apparatus using a light-emitting device (also referred to as a light-emitting element), one electrode of the light-emitting device is connected to a driving transistor and the luminance of the light-emitting device is controlled by current flowing through the driving transistor.

In a display apparatus, the threshold voltage (Vth) variation of a driving transistor is one factor for display image unevenness. Thus, it is preferable to incorporate a function of compensating Vth of a driving transistor in a pixel.

For Vth compensation in a pixel, an operation is used in which electrical continuity is established between a gate and a drain of a driving transistor after the driving transistor is set in an on state and image data is supplied from a source side so that the gate is charged or discharged until gate-source voltage (Vgs) becomes Vth. Through the operation, the image data can be written to the gate and Vth can be extracted.

Note that the charging or the discharging ends once drain-source voltage (Vds) becomes 0 V even when the driving transistor is in an on state; the change of Vgs stops at 0 V. Thus, in the case where the driving transistor is a p-channel transistor, Vth can be extracted when it is within a range from a negative value to 0 V; however, Vth cannot be extracted when it is a positive value. In addition, in the case where the driving transistor is an n-channel transistor, Vth can be extracted when it is within a range from a positive value to 0 V; however, Vth cannot be extracted when it is a negative value.

As display area becomes larger, the range of Vth variation of the driving transistor tends to be wider. Therefore, the Vth compensation function is preferably compatible with a wide range of Vth variation.

Accordingly, an object of one embodiment of the present invention is to provide a display apparatus having a threshold voltage compensation function compatible with a wide range of threshold voltage variation. Another object is to provide a display apparatus having excellent display characteristics. Another object is to provide an inexpensive display apparatus.

Another object is to provide a display apparatus with low power consumption. Another object is to provide a highly reliable display apparatus. Another object is to provide a novel display apparatus or the like. Another object is to provide a method for operating the display apparatus. Another object is to provide a novel semiconductor apparatus or the like.

Note that the description of these objects does not preclude the existence of other objects. Note that one embodiment of the present invention does not need to achieve all the objects. Note that other objects will be apparent from the description of the specification, the drawings, the claims, and the like, and other objects can be derived from the description of the specification, the drawings, the claims, and the like.

Means for Solving the Problems

One embodiment of the present invention relates to a display apparatus having a wide range of threshold voltage compensation function.

One embodiment of the present invention is a display apparatus including a first transistor, a second transistor, a third transistor, a fourth transistor, a fifth transistor, a capacitor, a light-emitting device in a pixel. The fourth transistor is a p-channel transistor. One of a source and a drain of the first transistor is electrically connected to one of a source and a drain of the second transistor and one electrode of the capacitor. The other of the source and the drain of the second transistor is electrically connected to one of a source and a drain of the third transistor and a gate of the fourth transistor. A source of the fourth transistor is electrically connected to the other electrode of the capacitor and one of a source and a drain of the fifth transistor. A drain of the fourth transistor is electrically connected to an anode of the light-emitting device.

Each of the first transistor and the third transistor can be an n-channel transistor. The second transistor can be a p-channel transistor. A gate of the first transistor can be electrically connected to a gate of the second transistor and a gate of the third transistor.

It is preferable that the first transistor and the third transistor each include a metal oxide in a channel formation region and the metal oxide include In, Zn, and M (M is one kind or plural kinds selected from Al, Ti, Ga, Ge, Sn, Y, Zr, La, Ce, Nd, and Hf).

The display apparatus can further include a sixth transistor. One of a source and a drain of the sixth transistor can be electrically connected to the drain of the fourth transistor.

An organic EL element or a micro LED can be used as the light-emitting device.

Another embodiment of the present invention is a method for operating a display apparatus including a first transistor, a second transistor, a capacitor, and a light-emitting device. The first transistor is a p-channel transistor. A source of the first transistor is electrically connected to one electrode of the capacitor. One of a source and a drain of the second transistor is electrically connected to the other electrode of the capacitor. The other of the source and the drain of the second transistor is electrically connected to a gate of the first transistor. A drain of the first transistor is electrically connected to an anode of the light-emitting device. The second transistor is set in an off state and a first potential for setting the first transistor in an on state is supplied to the gate of the first transistor. After a second potential is supplied to the source of the first transistor, the source of the first transistor is set to a third potential by a discharging operation of the first transistor. A fourth potential is supplied to the other electrode of the capacitor so that the capacitor retains a fifth potential corresponding to a difference between the fourth potential and the third potential. The other electrode of the capacitor is set in a floating state to set the second transistor in an on state so that the fifth potential is retained between the gate and the source of the first transistor. The second potential is supplied to the source of the first transistor, and current based on the fifth potential flows so that the light-emitting device emits light.

The second potential can be a potential higher than the sum of a cathode potential of the light-emitting device and forward voltage of the light-emitting device.

The third potential can be a potential corresponding to a difference between the first potential and the threshold voltage of the first transistor. The fourth potential can be image data.

Effect of the Invention

With the use of one embodiment of the present invention, it is possible to provide a display apparatus having a threshold voltage compensation function compatible with a wide range of threshold voltage variation. Alternatively, it is possible to provide a display apparatus having excellent display characteristics. Alternatively, it is possible to provide an inexpensive display apparatus.

Alternatively, it is possible to provide a display apparatus with low power consumption. Alternatively, it is possible to provide a highly reliable display apparatus. Alternatively, it is possible to provide a novel display apparatus or the like. Alternatively, it is possible to provide a method for operating the display apparatus. Alternatively, it is possible to provide a novel semiconductor apparatus or the like.

MODE FOR CARRYING OUT THE INVENTION

Figure 1:
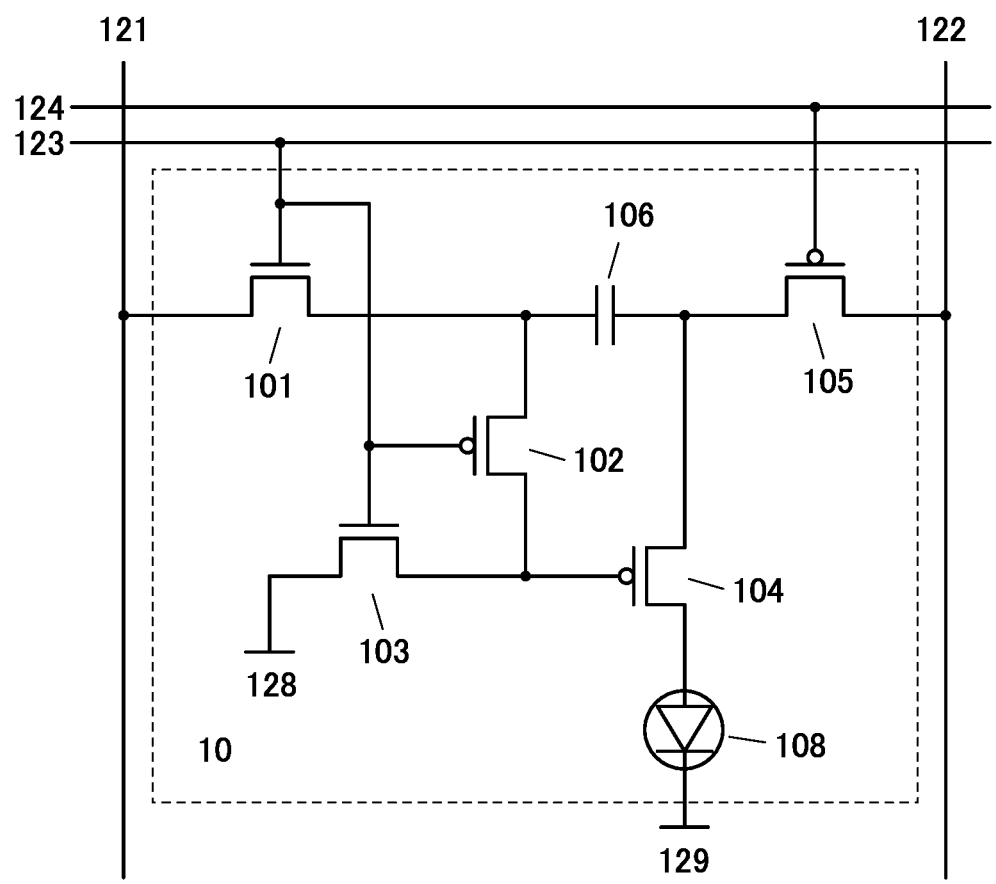
FIG. 1 is a diagram illustrating a pixel circuit.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, a display apparatus according to one embodiment of the present invention will be described with reference to drawings.

One embodiment of the present invention is a display apparatus including a light-emitting device in a pixel. The display apparatus has a function of compensating Vth of a driving transistor. A Vth compensable range is a wide range from positive voltage to negative voltage in a certain condition; thus, it is possible to compensate Vth even in the case of large Vth variation. Therefore, high-quality display can be performed. In addition, yield in a manufacturing process can be increased, so that manufacturing cost can be reduced.

In general, Vth of a driving transistor is compensated by performing charging or discharging of a gate and utilizing Vth extraction between the gate and a source when the charging or the discharging ends. Note that the charging or the discharging is performed through a source-drain-gate path; thus, the charging or the discharging ends when source-drain voltage (Vds) becomes 0 V. Thus, the Vth extraction does not occur in some cases. In such a case, when Vth varies from positive voltage to negative voltage, compensable transistors are limited.

In one embodiment of the present invention, a p-channel transistor is used as a driving transistor. Discharging is performed through a source-drain path while constant voltage is supplied to a gate so that Vth is extracted between the gate and the source. In addition, when a drain potential is set to the sum of forward voltage and a cathode potential of a light-emitting device or a potential sufficiently lower than the sum, it is possible to continue the discharging even when Vth is positive voltage. That is, compensation can be performed even in the case where Vth variation occurs from positive voltage to negative voltage.

FIG. 1 is a circuit diagram of a pixel included in a display apparatus according to one embodiment of the present invention. A pixel 10 includes a transistor 101, a transistor 102, a transistor 103, a transistor 104, a transistor 105, a capacitor 106, and a light-emitting device 108. Here, the transistor 101 and the transistor 103 can be n-channel transistors, and the transistor 102, the transistor 104, and the transistor 105 can be p-channel transistors.

One of a source and a drain of the transistor 101 is electrically connected to one electrode of the capacitor 106 and one of a source and a drain of the transistor 102. The other of the source and the drain of the transistor 102 is electrically connected to one of a source and a drain of the transistor 103 and a gate of the transistor 104. One of a source and a drain of the transistor 104 is electrically connected to the other electrode of the capacitor 106 and one of a source and a drain of the transistor 105. The other of the source and the drain of the transistor 104 is electrically connected to an anode of the light-emitting device 108. A gate of the transistor 101 is electrically connected to a gate of the transistor 102 and a gate of the transistor 103.

The other of the source and the drain of the transistor 101 is electrically connected to a wiring 121. The other of the source and the drain of the transistor 103 is electrically connected to a wiring 128. The other of the source and the drain of the transistor 105 is electrically connected to a wiring 122. A cathode of the light-emitting device 108 is electrically connected to a wiring 129. The gate of the transistor 101, the gate of the transistor 102, and the gate of the transistor 103 are electrically connected to a wiring 123. A gate of the transistor 105 is electrically connected to a wiring 124.

The wiring 121 is a source line that connects the pixel 10 to a source driver for supplying image data. The wiring 122 and the wiring 129 are power supply lines. The wiring 122 can be a high-potential power supply line (also referred to as an anode wiring), and the wiring 129 can be a low-potential power supply line (also referred to as a cathode wiring, a cathode electrode, or a common electrode). The wiring 128 is a wiring for supplying a constant potential. Each of the wiring 123 and the wiring 124 is a gate line that controls the operation of a transistor connected thereto.

Here, each of the transistor 101, the transistor 102, the transistor 103, and the transistor 105 functions as a switch. The transistor 104 functions as a driving transistor of the light-emitting device 108. The capacitor 106 functions as a storage capacitor.

Figure 2A:
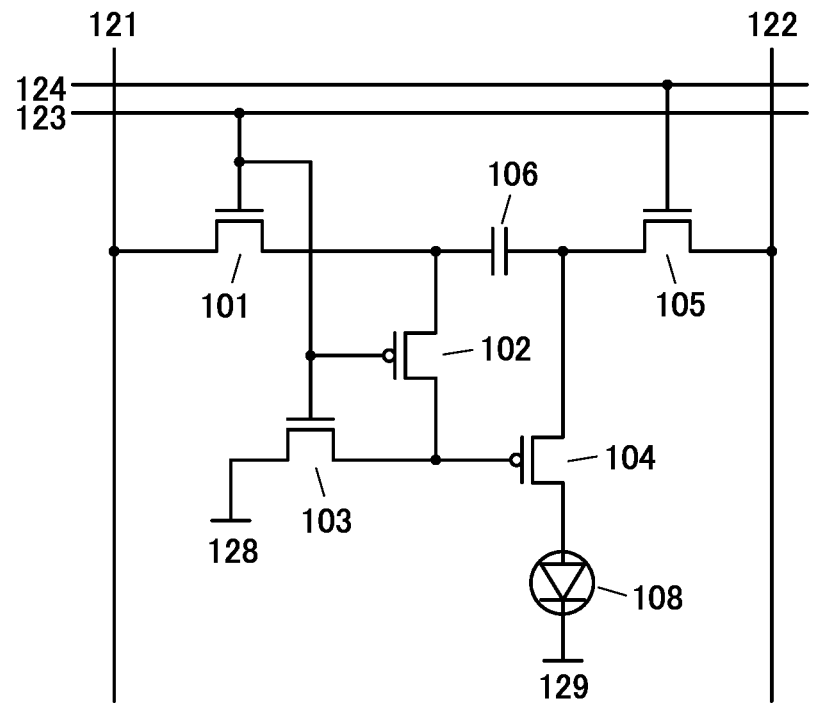
FIG. 2A and FIG. 2B are diagrams each illustrating a pixel circuit.

Note that although the transistor 105 is illustrated as a p-channel transistor in FIG. 1, the transistor 105 may be an n-channel transistor, as illustrated in FIG. 2A.

Figure 2B:
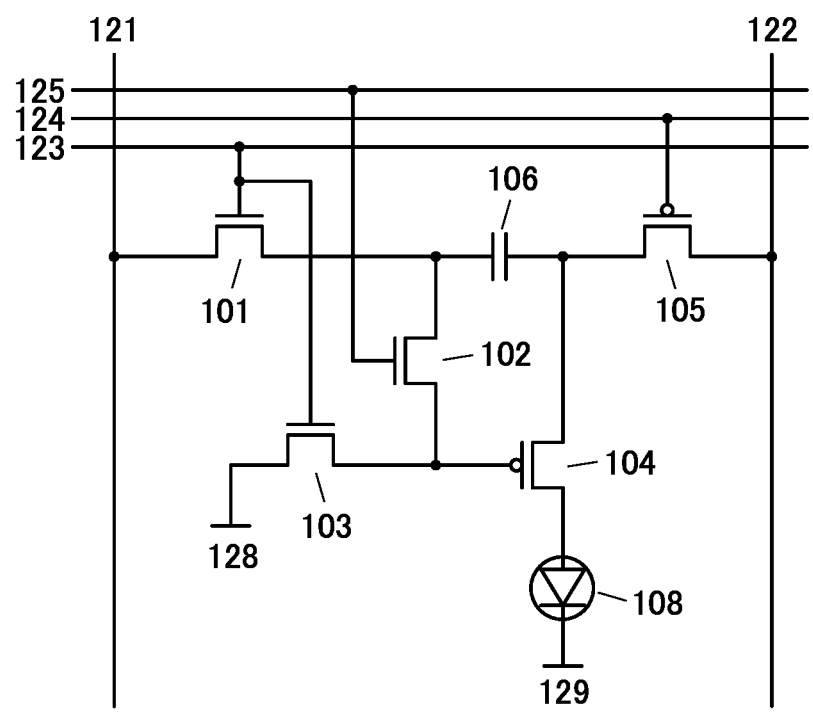

In addition, although the transistor 102 is illustrated as a p-channel transistor in FIG. 1, the transistor 102 may be an n-channel transistor, as illustrated in FIG. 2B. In that case, the gate of the transistor 102 is electrically connected to a wiring 125 functioning as a gate line.

In addition, in a structure of FIG. 2B, the transistor 105 may be an n-channel transistor. Furthermore, in the structure of FIG. 2B, the transistor 101, the transistor 102, and the transistor 103 may be p-channel transistors.

Note that the transistor 101 and the transistor 103, and the transistor 102 are operated so that their on state and off state are in an inverse relationship; thus, a gate wiring can be shared when the transistor 101 and the transistor 103 are n-channel transistors and the transistor 102 is a p-channel transistor, as illustrated in FIG. 1. In addition, the transistor 101 and the transistor 103 may be p-channel transistors, and the transistor 102 may be an n-channel transistor.

Here, each of the transistor 101, the transistor 102, the transistor 103, and the transistor 105 functions as a switch; thus, a conductivity type of either an n-channel type or a p-channel type can be employed. It is further preferable that the transistor 104 functioning as a driving transistor be a p-channel transistor.

The display apparatus includes a plurality of light-emitting devices 108. A cathode of each of the plurality of light-emitting devices 108 is connected to the wiring 129. Here, in the case where a light-transmitting conductive film (for example, indium tin oxide or the like) having higher resistance than metal is used for the wiring 129, a voltage drop sometimes occurs in the wiring 129 when a large amount of current flows in display with a high grayscale level (high luminance). At the time of light emission, the light-emitting device 108 also operates as a constant voltage element; therefore, as the potential of the wiring 129 (the cathode potential) changes, the anode potential also changes.

In the case where an n-channel transistor is used as the transistor 104, the source of the transistor 104 is electrically connected to the anode of the light-emitting device 108. In the case where the potential of the wiring 129 fluctuates due to the voltage drop, the source potential of the transistor 104 fluctuates. Therefore, the gate-source voltage (Vgs) of the transistor 104 changes, and a problem of not being able to obtain desired luminance arises. In addition, in order to write ideal Vgs, a transistor for supplying a reset potential to the source needs to be provided.

In contrast, in the case where the transistor 104 is a p-channel transistor, the source of the transistor 104 is electrically connected to the wiring 122 (anode wiring) through the transistor 105. The voltage drop hardly occurs because a low-resistance metal wiring or the like can be used as the wiring 122 (anode line). Therefore, the source potential can be stabilized, and the Vgs fluctuation can be suppressed. In addition, the transistor for supplying a reset potential to the source is not needed. Next, conventional Vth compensation is described. FIG. 3A, FIG. 3B, FIG. 4A, and FIG. 4B are diagrams illustrating an example of using a p-channel transistor as a driving transistor. Transistors other than a driving transistor TrP are illustrated as a switch SW1 to a switch SW5.

The switch SW1 has a function of supplying voltage ini to a gate of the driving transistor TrP. The switch SW2 has a function of establishing electrical continuity between the gate and a drain of the driving transistor TrP. The switch SW3 has a function of supplying image data (Vdata) to a source of the driving transistor TrP. The switch SW4 has a function of supplying a potential Vano to the source of the driving transistor TrP. The switch SW5 has a function of establishing electrical continuity between the drain of the driving transistor TrP and an anode of a light-emitting device LED.

Figure 3A:
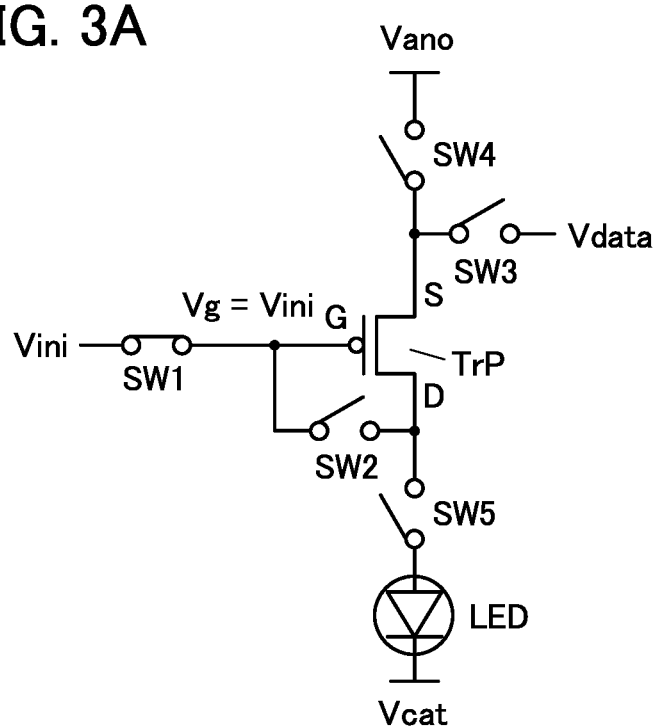
FIG. 3A and FIG. 3B are diagrams illustrating a conventional threshold voltage compensation operation.

First, the switch SW1 is brought into conduction so that the gate voltage (Vg) of the driving transistor TrP is set to voltage Vini (see FIG. 3A). Here, the voltage Vini is voltage at which the driving transistor TrP is set in an on state. Note that in FIGS. 3A, S, D, and G denote a source, a drain, and a gate, respectively.

Figure 3B:
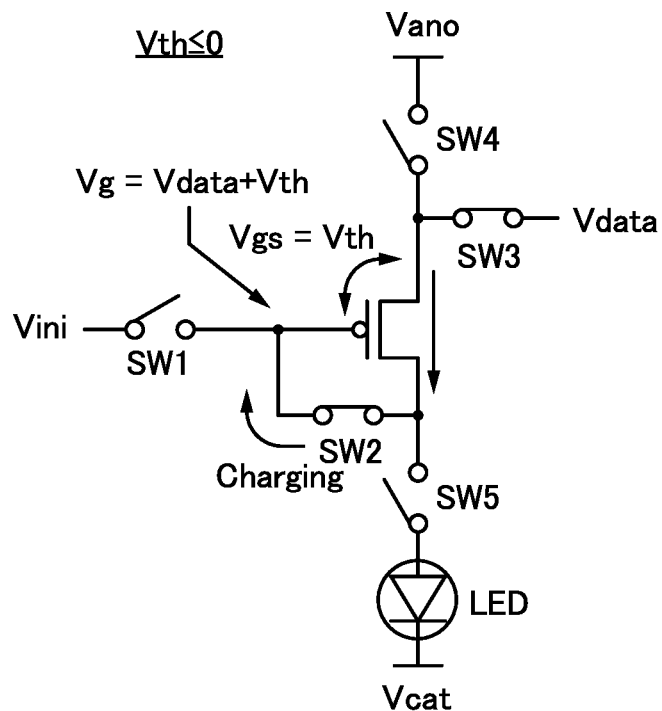

Next, the switch SW1 is brought out of conduction, and the switch SW2 and the switch SW3 are brought into conduction (see FIG. 3B). At this time, since the driving transistor TrP is in an on state, the gate is charged through the drain. In the case where Vth of the driving transistor is lower than or equal to 0 V, the charging ends when Vgs reaches Vth. At this time, Vg equals Vdata+Vth.

Figure 4A:
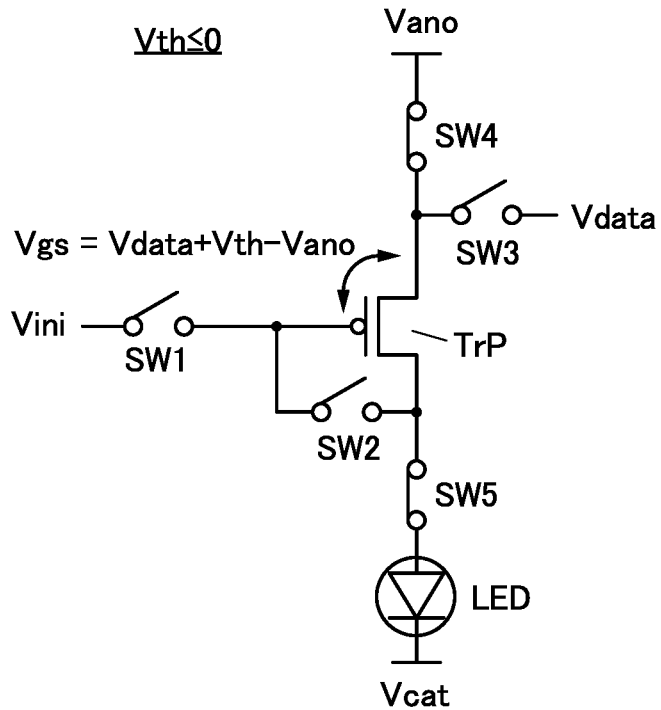
FIG. 4A and FIG. 4B are diagrams illustrating the conventional threshold voltage compensation operation.

Next, the switch SW2 and the switch SW3 are brought out of conduction, and the switch SW4 and the switch SW5 are brought into conduction (see FIG. 4A). At this time, the potential Vano is supplied to the source of the driving transistor TrP, and Vgs equals Vdata+Vth−Vano because Vg equals Vdata+Vth.

The general formula of drain current Id in a transistor saturation region is $Id = \frac{1}{2}\beta(Vgs-Vth)^2$ ($\beta$ is a coefficient). In the formula, if Vgs at an operation in FIG. 4A is substituted, Id equals $\frac{1}{2}\beta(Vdata+Vth-Vano-Vth)^2 = \frac{1}{2}\beta(Vdata-Vano)^2$. That is, the term of Vth disappears, the drain current Id becomes current that is independent of Vth, and Vth compensation has been performed.

The above is the case where Vth of the driving transistor TrP is lower than or equal to 0 V, and the case where Vth of the driving transistor TrP is higher than 0 V is described next.

Figure 4B:
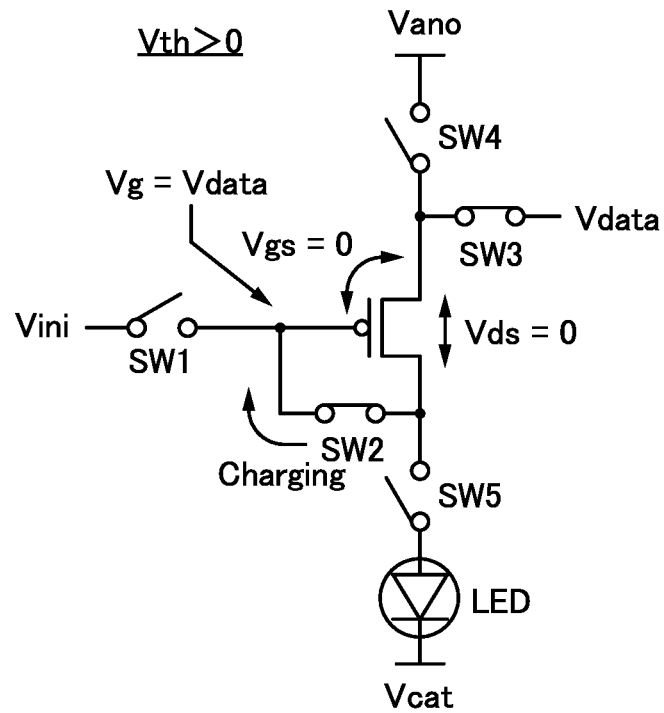

After the step illustrated in FIG. 3A, the switch SW1 is brought out of conduction, and the switch SW2 and the switch SW3 are brought into conduction (see FIG. 4B). At this time, since the driving transistor TrP is in an on state, the gate is charged through the drain. Even in the case where Vth of the driving transistor is higher than 0 V, the gate is in an on state until Vgs reaches Vth.

However, source-drain voltage (Vds) becomes 0 V when Vg reaches Vd=Vdata, and then the charging ends. At this time, since Vgs equals 0 V, compensable Vth is up to 0 V with this method. That is, in the case where Vth of the driving transistor TrP is positive voltage, compensation is impossible.

Next, a conventional Vth compensation method in a pixel when an n-channel transistor is used as a driving transistor is described using FIG. 5A, FIG. 5B, FIG. 6A, and FIG. 6B. The functions of the switch SW1 to the switch SW5 are the same as those described above.

Figure 5A:
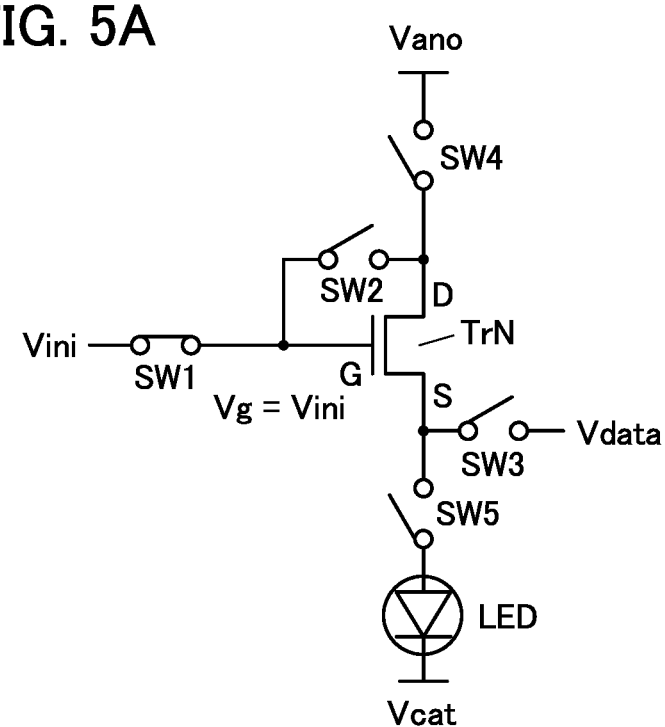
FIG. 5A and FIG. 5B are diagrams illustrating a conventional threshold voltage compensation operation.

First, the switch SW1 is brought into conduction so that the gate voltage (Vg) of a driving transistor TrN is set to voltage Vini (see FIG. 5A). Here, the voltage Vini is voltage at which the driving transistor TrN is set in an on state. Note that instead of the voltage Vini, the potential Vano may be supplied to a gate of the driving transistor TrN by bringing the switch SW2 and the switch SW4 into conduction. In addition, in FIGS. 5A, S, D, and G denote a source, a drain, and a gate, respectively.

Figure 5B:
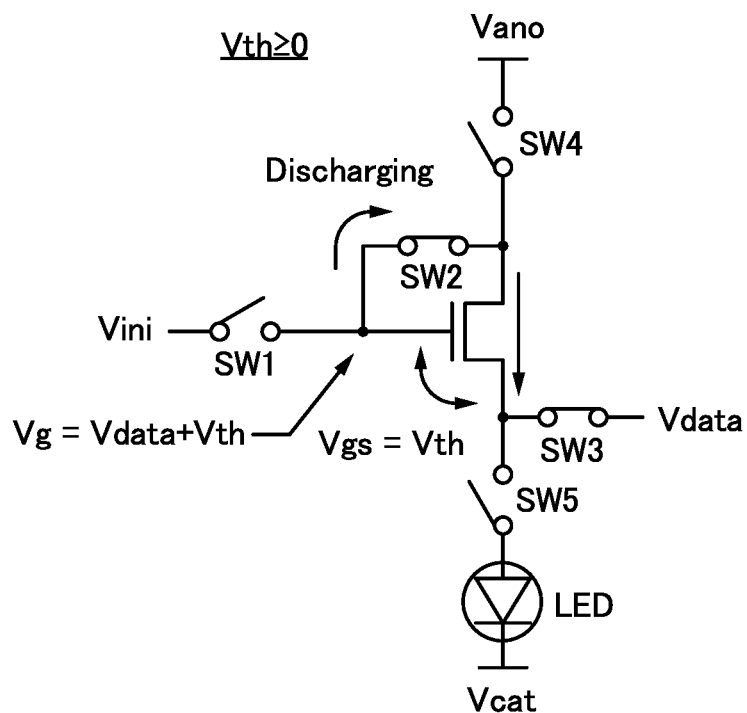

Next, the switch SW1 is brought out of conduction, and the switch SW2 and the switch SW3 are brought into conduction (see FIG. 5B). At this time, since the driving transistor TrN is in an on state, the gate is discharged through the drain. In the case where Vth of the driving transistor is higher than or equal to 0 V, the discharging ends when Vgs reaches Vth. At this time, Vg equals Vdata+Vth.

Figure 6A:
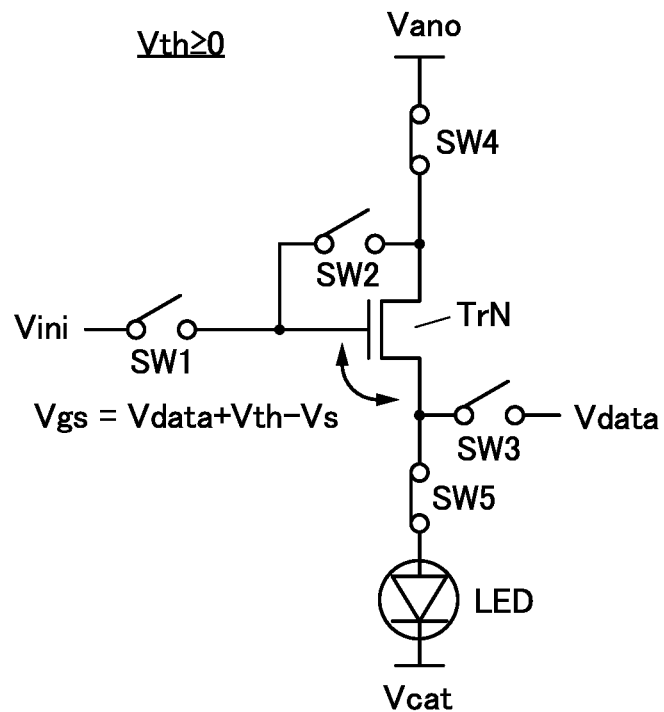
FIG. 6A and FIG. 6B are diagrams illustrating the conventional threshold voltage compensation operation.

Next, the switch SW2 and the switch SW3 are brought out of conduction, and the switch SW4 and the switch SW5 are brought into conduction (see FIG. 6A). At this time, the potential Vano is supplied to a drain of the driving transistor TrN, and source voltage (Vs) becomes a potential that is higher than a cathode potential (Vcat) of the light-emitting device LED by the forward voltage of the light-emitting device LED. Here, Vgs equals Vdata+Vth−Vs because Vg equals Vdata+Vth.

In the general formula of the drain current Id in the transistor saturation region, which is $Id=\frac{1}{2}\beta(Vgs-Vth)^2$ ($\beta$ is a coefficient), if Vgs at an operation in FIG. 6A is substituted, Id equals $\frac{1}{2}\beta(Vdata+Vth-Vs-Vth)^2=\frac{1}{2}\beta(Vdata-Vs)^2$. That is, the term of Vth disappears, the drain current Id becomes current that is independent of Vth, and Vth compensation has been performed.

The above is the case where Vth of the driving transistor TrN is higher than or equal to 0 V, and the case where Vth of the driving transistor TrN is lower than 0 V is described next.

Figure 6B:
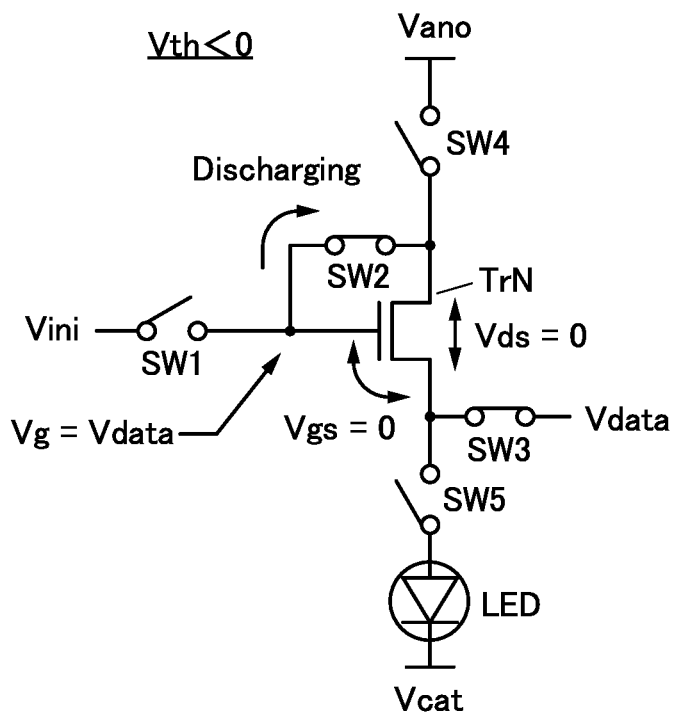

After the step illustrated in FIG. 5A, the switch SW1 is brought out of conduction, and the switch SW2 and the switch SW3 are brought into conduction (see FIG. 6B). At this time, since the driving transistor TrN is in an on state, the gate is discharged through the drain. Even in the case where Vth of the driving transistor is lower than 0 V, the gate is in an on state until Vgs reaches Vth.

However, source-drain voltage (Vds) becomes 0 V when Vg reaches Vd=Vdata, and then the discharging ends. At this time, since Vgs equals 0 V, compensable Vth is up to 0 V with this method. That is, in the case where Vth of the driving transistor TrN is negative voltage, compensation is impossible.

Figure 7:
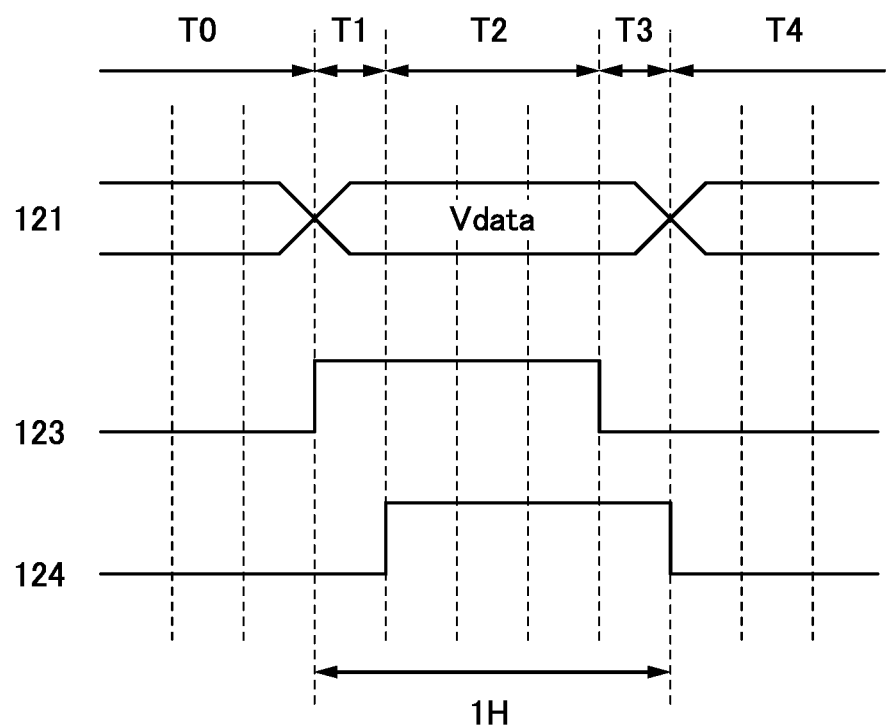
FIG. 7 is a timing chart showing a pixel operation.

Next, Vth compensation in the pixel 10 illustrated in FIG. 1 is described in accordance with a timing chart shown in FIG. 7. H in the timing chart means one horizontal period. Note that in the following description, a high potential for setting an n-channel transistor in an on state and setting a p-channel transistor in an off state is denoted by "H," and a low potential for setting an n-channel transistor in an off state and setting a p-channel transistor in an on state is denoted by "L."

In addition, the potential Vano, a potential V0, and the potential Vcat are supplied to the wiring 122, the wiring 128, and the wiring 129, respectively. Here, the potential Vano is a high potential and the potential Vcat is a low potential. The potential Vano is a potential that is higher than the sum of the potential Vcat and the forward voltage of the light-emitting device 108. Furthermore, the potential V0 is a potential at which the transistor 104 can be set in an on state.

In addition, description is made by referring diagrams illustrating circuit operations in FIG. 8A, FIG. 8B, FIG. 9A, and FIG. 9B. Note that a circle and a cross in the drawings denote conduction of a transistor and non-conduction of a transistor, respectively.

Period T0 is a light emission (image display) period in accordance with image data that has been written in the previous horizontal period. At this time, the potential of the wiring 123 is "L," and the potential of the wiring 124 is "L."

In Period T1, the image data (Vdata) is supplied to the wiring 121. In addition, the potential of the wiring 123 is set to "H" and the potential of the wiring 124 is "L," so that the transistor 101, the transistor 103, and the transistor 105 are brought into conduction (see FIG. 8A).

When the transistor 101 is brought into conduction, the potential of one electrode of the capacitor 106 becomes Vdata. In addition, when the transistor 103 is brought into conduction, the gate voltage (Vg) of the transistor 104 that is the driving transistor becomes V0.

In addition, when the transistor 105 is brought into conduction, the source voltage (Vs) becomes Vano, and Vgs equals V0−Vano. This period can also be referred to as an initialization period for Vg and Vs of the transistor 104. At this time, the light-emitting device 108 emits light; however, the influence on visibility can be suppressed by setting Period T1 as an extremely short period.

Figure 8A:
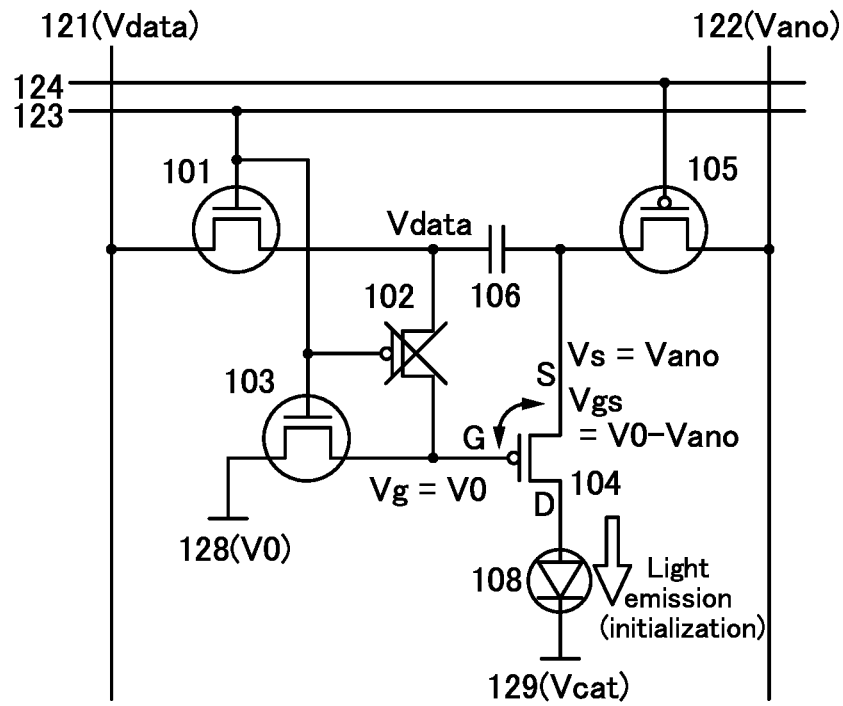
FIG. 8A and FIG. 8B are diagrams illustrating a threshold voltage compensation operation.
Figure 8B:
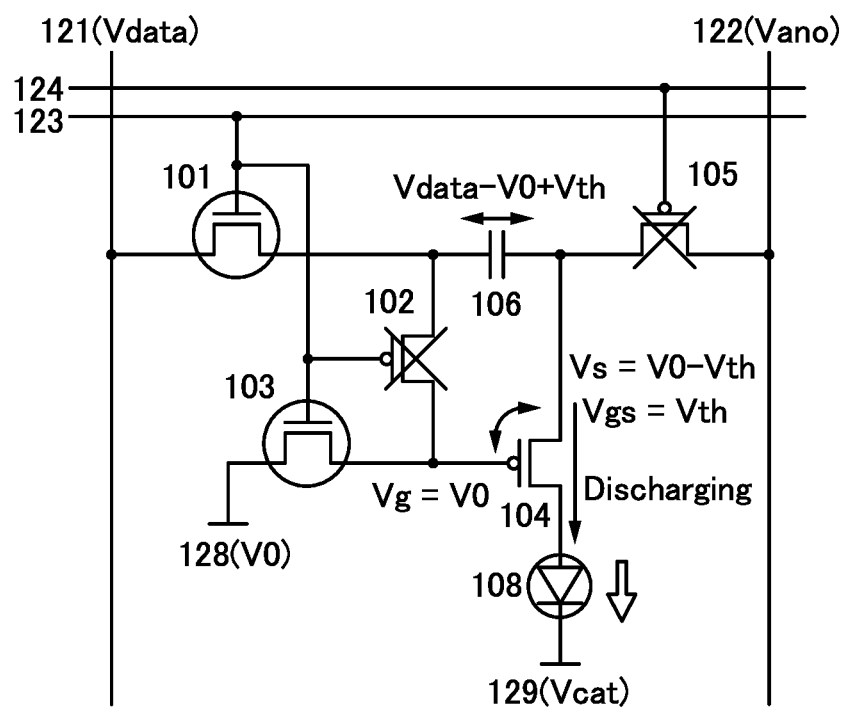

Next, in Period T2, the potential of the wiring 124 becomes "H," so that the transistor 105 is brought out of conduction (see FIG. 8B).

At this time, the source of the transistor 104 is discharged through the light-emitting device 108. The discharging ends when Vgs equals Vth. Thus, Vs equals V0−Vth. In addition, the potential of the other electrode of the capacitor 106 becomes V0−Vth, so that Vdata−V0+Vth is retained in the capacitor 106.

Next, in Period T3, the potential of the wiring 123 becomes "L," the transistor 101 and the transistor 103 are brought out of conduction, and the one electrode of the capacitor 106 is set in a floating state. In addition, the transistor 102 is brought into conduction (see FIG. 9A).

At this time, electric charge retained in the capacitor 106 is distributed to the gate of the transistor 104, so that Vg equals Vdata. In addition, Vgs equals Vdata−V0+Vth. Note that in reality, Vg has a value different from that of Vdata; however, when the capacitance of the capacitor 106 is sufficiently larger than the gate capacitance of the transistor 104, Vg can have a value very close to that of Vdata.

Figure 9A:
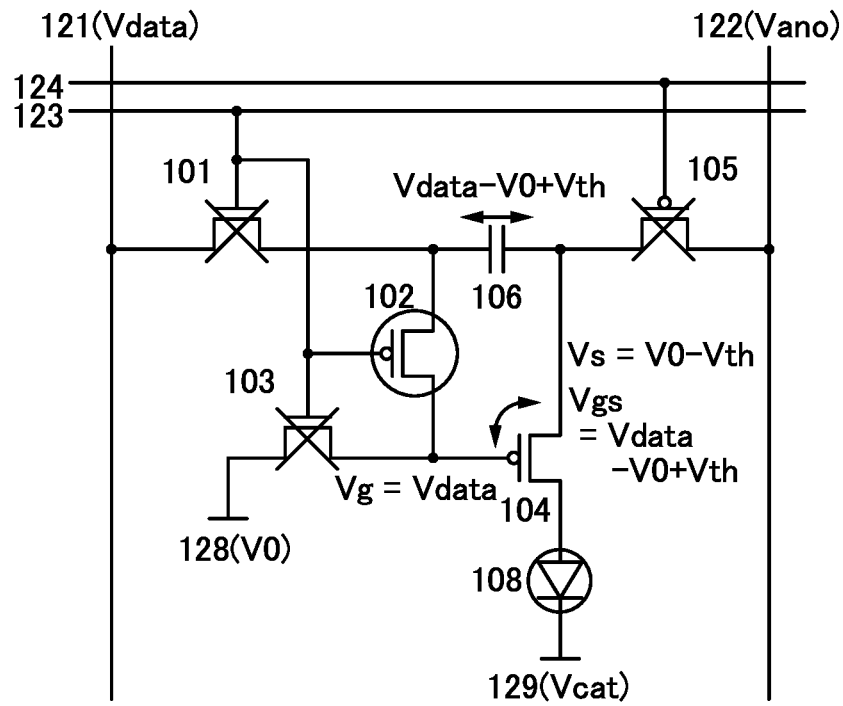
FIG. 9A and FIG. 9B are diagrams illustrating the threshold voltage compensation operation.
Figure 9B:
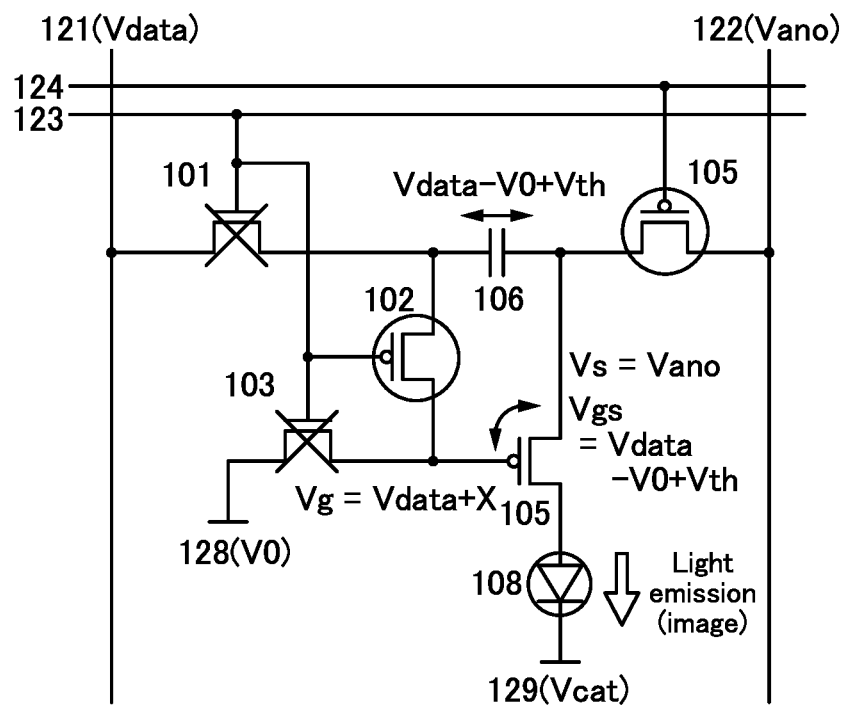

Next, in Period T4, the potential of the wiring 124 becomes "L," so that the transistor 105 is brought into conduction (see FIG. 9B).

At this time, Vs equals Vano, and Vg equals Vdata+X (X corresponds to a change in Vs) by capacitive coupling of the capacitor 106; however, Vgs=Vdata−V0+Vth is retained. Therefore, if Vgs described above is substituted in the general formula of the drain current Id in the transistor saturation region (Id=½β (Vgs−Vth)$^2$ (β is a coefficient)), Id equals ½β (Vdata−V0+Vth−Vth)$^2$=½β (Vdata−V0)$^2$. That is, the term of Vth disappears, the drain current Id becomes current that is independent of Vth, and Vth compensation has been performed.

Here, a Vth compensation range is described. Since Vth is extracted as Vgs, the allowable range of Vgs corresponds to the Vth compensation range. The discharging of the source of the transistor 104 starts when the transistor 105 illustrated in FIG. 8B is brought out of conduction; thus, Vgs=V0−Vano, which is shown in FIG. 8A representing a state immediately before the start of the discharging, corresponds to the lower limit of a compensable range.

In addition, the discharging ends at Vds=0 V, that is, in a state where the drain voltage (Vd) equals Vs. Here, Vd is higher than the potential (cathode potential) of the wiring 129 by the forward voltage (Vf) of the light-emitting device 108, so that Vd becomes Vcat+Vf. In other words, the discharging ends when Vs reaches Vcat+Vf. Vgs=V0−Vcat−Vf at this time corresponds to the upper limit of the compensable range.

Accordingly, the Vth compensation range of the pixel according to one embodiment of the present invention is higher than or equal to V0−Vano and lower than or equal to V0−Vcat−Vf. For example, when V0 equals +8 V, Vano equals +10 V, Vcat equals −2 V, and Vf equals +5 V, Vth compensation is possible if the Vth variation range is −2 V<Vth<+5 V. As illustrated in FIG. 4B or FIG. 6B, the lower limit or the upper limit is 0 V in conventional Vth compensation; thus, it is found that the Vth compensation function according to one embodiment of the present invention is excellent because it is compatible with a wide range of Vth variation.

Note that from FIG. 8A to FIG. 8B, light emission that is irrelevant to image data occurs in the light-emitting device 108; however, when Period T1 is set as the extremely short time as described above, the influence on visibility can be suppressed. In particular, in a high-definition display apparatus with a large number of pixel rows, the light emission period is shortened because one horizontal period is shortened.

For example, in the case of a display apparatus including 4K2K pixels, the number of pixel rows is 2160. Even when the light emission continues during one horizontal period, a light emission period per unit time is ½₁₆₀, and the time for 2159/2160 is a normal image display period. Since the actual light emission period is much shorter, a normal image display state is dominant as a whole, and the influence of the light emission on visibility can be suppressed.

Figure 10A:
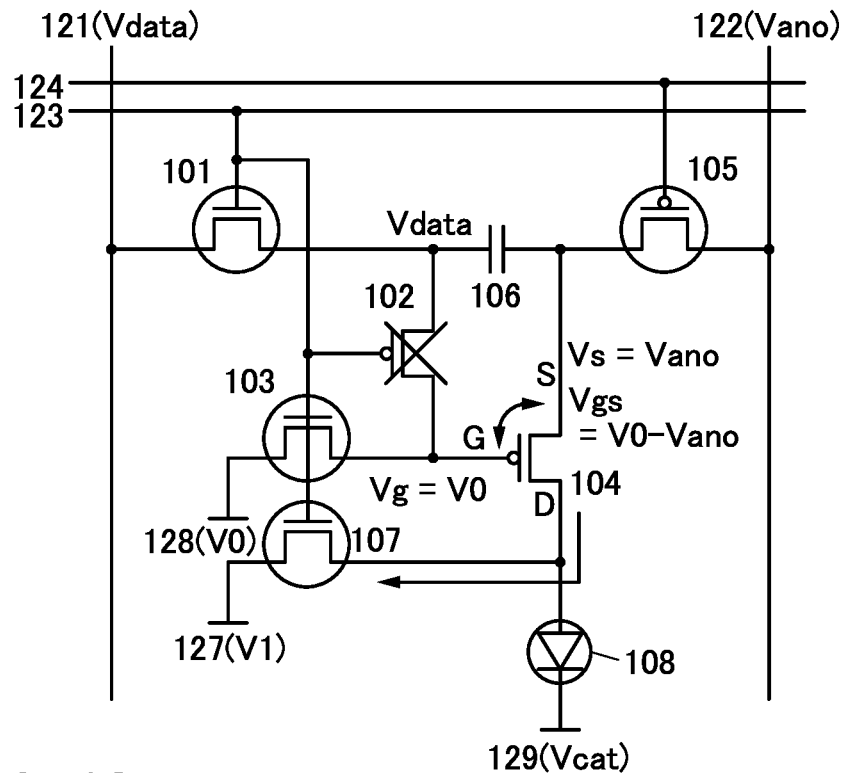
FIG. 10A and FIG. 10B are diagrams each illustrating a pixel circuit.

Note that as illustrated in FIG. 10A, addition of the transistor 107 enables a similar Vth compensation operation without the light emission. One of a source and a drain of the transistor 107 is electrically connected to the drain of the transistor 104. The other of the source and the drain of the transistor 107 is electrically connected to the wiring 127. A gate of the transistor 107 is electrically connected to the wiring 123.

Here, the wiring 127 can be, for example, a wiring for supplying a low potential V1 (V1<Vcat+Vf). In addition, the operation of the transistor 107 is common to those of the transistor 101 and the transistor 103 and thus a gate line can be shared between the transistor 107, and the transistor 101 and the transistor 103. The conductivity type of the transistor 107 is the same as those of the transistor 101 and the transistor 103.

FIG. 10A illustrates the operation in Period T1 in the timing chart shown in FIG. 7 and corresponds to an operation similar to the operation in FIG. 8A. In the structure illustrated in FIG. 10A, current flows from the transistor 104 to the wiring 127 through the transistor 107; thus, the light emission of the light-emitting device 108 can be suppressed. In addition, the discharging of the source of the transistor 104 in Period T2 can also be performed through the transistor 107.

Note that in the structure illustrated in FIG. 10A, the Vth compensation range is slightly different. In the structure illustrated in FIG. 10A, Vd equals V1 during the discharging; thus, the discharging ends when Vs reaches V1. Vgs=V0−V1 at this time corresponds to the upper limit of the compensable range. Therefore, the Vth compensation range is higher than or equal to V0−Vano and lower than or equal to V0−V1.

A transistor including a metal oxide in a channel formation region (hereinafter, an OS transistor) is preferably used as each of the transistor 101 and the transistor 102 that are n-channel transistors. In the OS transistor, a semiconductor layer has a large energy gap, and thus the OS transistor can have an extremely low off-state current of several yoctoamperes per micrometer (current per micrometer of channel width).

The gate potential of the transistor 104 can be retained for a long time by the low off-state current characteristics of the OS transistor. Accordingly, an image can be retained even when frame frequency is lowered. For example, switching between first frame frequency (for example, higher than or equal to 60 Hz) in moving image display and second frame frequency that is lower than the first frame frequency (for example, approximately 1 to 10 Hz) in still image display can reduce power consumption of the display apparatus.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

An OS transistor has features such that impact ionization, an avalanche breakdown, a short-channel effect, and the like do not occur, which are different from those of a transistor where silicon is contained in a channel formation region (hereinafter, a Si transistor), and enables formation of a highly reliable circuit. Moreover, variation in electrical characteristics due to crystallinity unevenness, which is caused in Si transistors, is less likely to occur in OS transistors.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide can be formed by an ALD (Atomic layer deposition) method.

It is preferable that the atomic ratio of metal elements in a sputtering target used to form an In-M-Zn oxide by a sputtering method satisfy In M and Zn M. The atomic ratio of metal elements of such a sputtering target is preferably InM:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, InM:Zn=5:1:8, or the like. Note that the atomic ratio in the deposited semiconductor layer varies from the atomic ratio of metal elements contained in the sputtering target in a range of ±40%.

An oxide semiconductor with low carrier concentration is used for the semiconductor layer. For example, for the semiconductor layer, an oxide semiconductor whose carrier concentration is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/$cm^3$, preferably lower than or equal to $2\times10^{16}$ atoms/$cm^3$.

Furthermore, when nitrogen is contained in the oxide semiconductor that constitutes the semiconductor layer, electrons serving as carriers are generated and the carrier concentration is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/$cm^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Moreover, the semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, will be described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as InO$_{X1}$ (X1 is a real number greater than 0)) or indium zinc oxide (hereinafter referred to as In$_{X2}$Zn$_{Y2}$O$_{Z2}$ (each of X2, Y2, and Z2 is a real number greater than 0)) and gallium oxide (hereinafter referred to as GaO$_{X3}$ (X3 is a real number greater than 0)), gallium zinc oxide (hereinafter referred to as Ga$_{X4}$Zn$_{Y4}$O$_{Z4}$ (each of X4, Y4, and Z4 is a real number greater than 0)), or the like so that a mosaic pattern is formed, and mosaic-like InO$_{X1}$ or In$_{X2}$Zn$_{Y2}$O$_{Z2}$ is evenly distributed in the film (this composition is hereinafter also referred to as a cloud-like composition).

That is, the CAC-OS is a composite oxide semiconductor having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1\leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment. Meanwhile, the CAC-OS relates to the material composition of an oxide semiconductor.

In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where GaO$_{X3}$ is a main component and the region where In$_{X2}$Zn$_{Y2}$O$_{Z2}$ or InO$_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan—View direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern. Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor device, the insulating property derived from $GaO_{X3}$ or the like and the conductivity derived from $In_{X2}Zn_{Y2}O_{Z2}$ or $InO_{X1}$ complement each other, so that high on-state current (Ion) and high field-effect mobility (μ) can be achieved.

In addition, a semiconductor device using the CAC-OS has high reliability. Thus, the CAC-OS is suitable for a constituent material of a variety of semiconductor apparatuses.

Figure 10B:
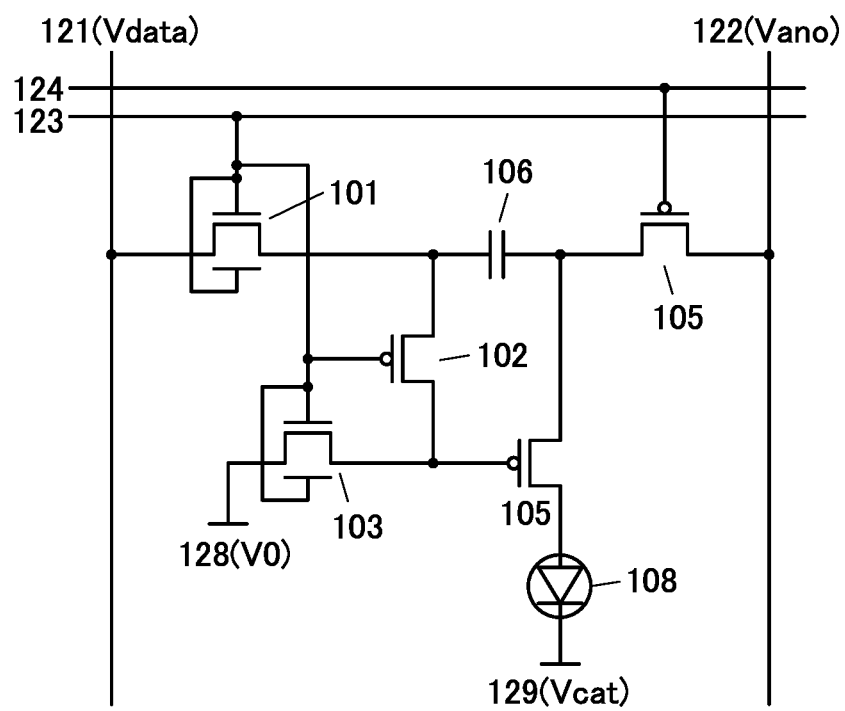

Note that in the case where an OS transistor is used as each of the n-channel transistors, a structure with a back gate as illustrated in FIG. 10B may be employed. Supplying the same potential to the back gate to a front gate can increase on-state current. Alternatively, a constant potential may be supplied to the back gate. Supplying a constant potential to the back gate can control the threshold voltage.

It is preferable to use a transistor including silicon in a channel formation region as each of the transistor 102, the transistor 104, and the transistor 105 that are p-channel transistors.

Amorphous silicon, microcrystalline silicon, polycrystalline silicon, single crystal silicon, or the like can be used for the channel formation region of the Si transistor. Note that polycrystalline silicon is preferably used in the case where a transistor is provided on an insulating surface of a glass substrate or the like.

High-quality polycrystalline silicon can be obtained easily by using a laser crystallization step or the like, and a transistor with high mobility can be formed even in the case of a p-channel type. In addition, the high-quality polycrystalline silicon can be also obtained by a solid-phase growth method in which a metal catalyst such as nickel or palladium is added to amorphous silicon and then heated. Furthermore, to enhance crystallinity, the polycrystalline silicon formed by the solid-phase growth method using a metal catalyst may be subjected to laser irradiation. Note that the metal catalyst remains in the polycrystalline silicon and worsens electrical characteristics of the transistor; therefore, it is preferable to provide a region to which phosphorus, a noble gas, or the like is added other than the channel formation region, so that the region captures the metal catalyst.

Note that structures by which the effect of one embodiment of the present invention is obtained are not limited to those described above: Si transistors may be used as all the transistors included in the pixel. Alternatively, OS transistors may be used as all the transistors included in the pixel.

Figure 11:
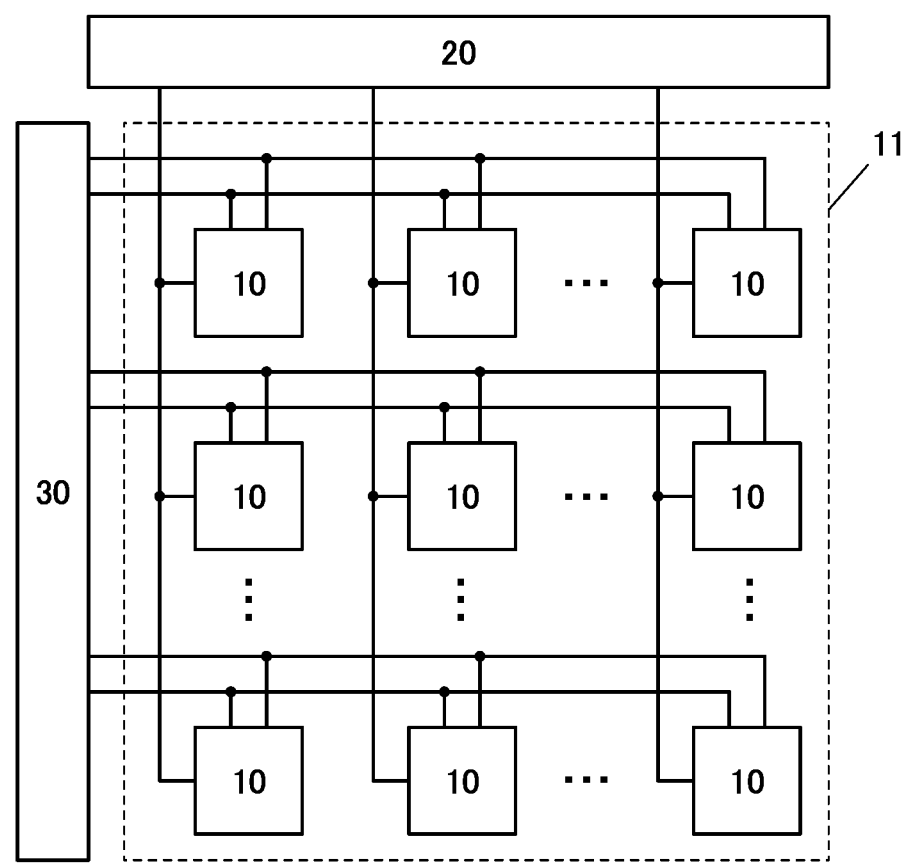
FIG. 11 is a diagram illustrating a display apparatus.

FIG. 11 is a diagram illustrating a display apparatus according to one embodiment of the present invention. The display apparatus includes a pixel array 11, a source driver 20, and a gate driver 30. The pixel array 11 includes pixels 10 arranged in a column direction and a row direction. The pixel 10 has the function of compensating Vth of a driving transistor, which is described in this embodiment. Note that wirings are illustrated in a simplified way in the drawing, and the wirings connected to the components of the pixel 10 according to one embodiment of the present invention are provided.

A sequential logic circuit such as a shift register can be used for each of the source driver 20 and the gate driver 30.

Note that for the source driver 20 and the gate driver 30, a method in which an IC chip is attached externally by a COF (chip on film) method, a COG (chip on glass) method, a TCP (tape carrier package) method, or the like can be used. Alternatively, the source driver 20 and the gate driver 30 may be formed on the same substrate as that of the pixel array 11 by using transistors manufactured using steps common to those of the pixel array 11.

Although an example in which the gate driver 30 is placed on one side of the pixel array 11 is shown, two gate drivers 30 may be placed with the pixel array 11 therebetween to divide driving rows.

Figure 12:
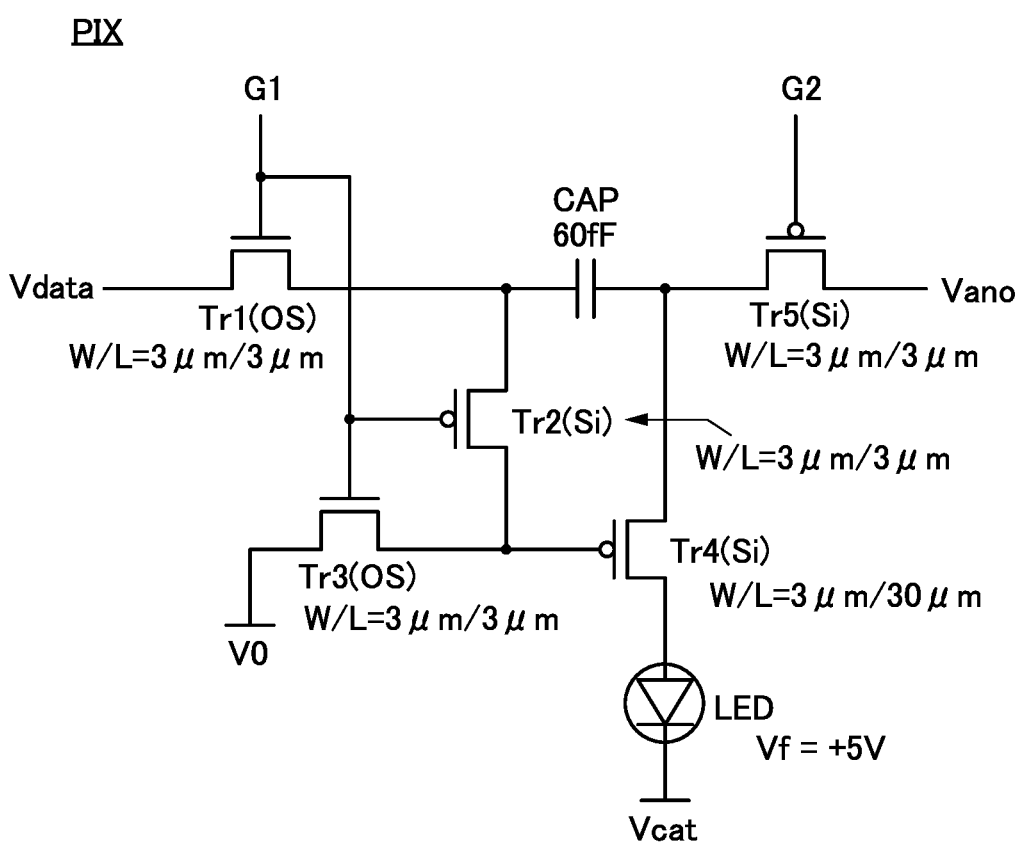
FIG. 12 is a diagram illustrating a pixel used for simulation.

Next, simulation results of pixel operations are described. FIG. 12 illustrates a structure of a pixel PIX used in the simulation. The pixel PIX is the same as the pixel circuit illustrated in FIG. 1. A transistor Tr1 and a transistor Tr3 are n-channel OS transistors, and a transistor Tr2, a transistor Tr4, and a transistor Tr5 are p-channel Si transistors.

Each parameter used in the simulation was as follows. For transistor size, W/L=3 μm/3 μm (the transistor Tr1, the transistor Tr2, the transistor Tr3, and the transistor Tr5) and W/L=3 μm/30 μm (the transistor Tr4: a driving transistor) were used. The capacitance of a capacitor CAP was 60 fF, the forward voltage Vf of a light-emitting device LED was +5 V. "H" voltage and "L" voltage applied to a gate of the transistor were +15 V and −5 V, respectively. An anode potential (Vano) was +10 V, the cathode potential (Vcat) was −2 V or −6 V, and voltage V0 was +8 V or +4 V. Image data Vdata was 0 V to +8 V, and a horizontal period was 8.3 μs. Note that SPICE was used as circuit simulation software. In addition, for operations without Vth compensation, simulation was performed by changing a circuit configuration to avoid input of the voltage V0 to the gate.

Figure 13A:
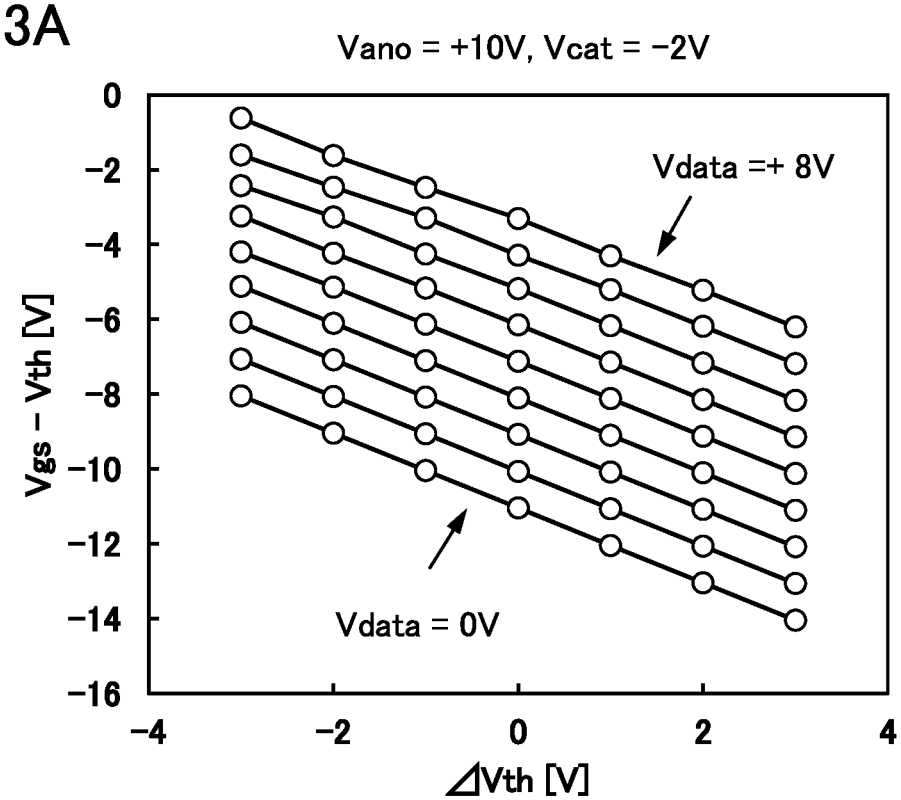
FIG. 13A and FIG. 13B are diagrams showing simulation results.

FIG. 13A shows simulation results of the operation without Vth compensation at Vano=+10 V and Vcat=−2 V. Here, the horizontal axis represents the shift amount (ΔVth) in consideration of variation from Vth (−0.2 V), which is a reference, and the vertical axis represents Vgs−Vth (a value in a light emission period) that is proportional to the drain current Id. In addition, the image data Vdata was calculated on a scale of 9 from 0 V to +8 V (in 1 V steps). As described above, Vgs includes Vth extracted in a Vth compensation operation. Thus, Vgs−Vth is ideally independent of ΔVth and tends to be flat. It is found that in the operation without Vth compensation, Vgs−Vth significantly changes when the absolute value of ΔVth is large.

Figure 13B:
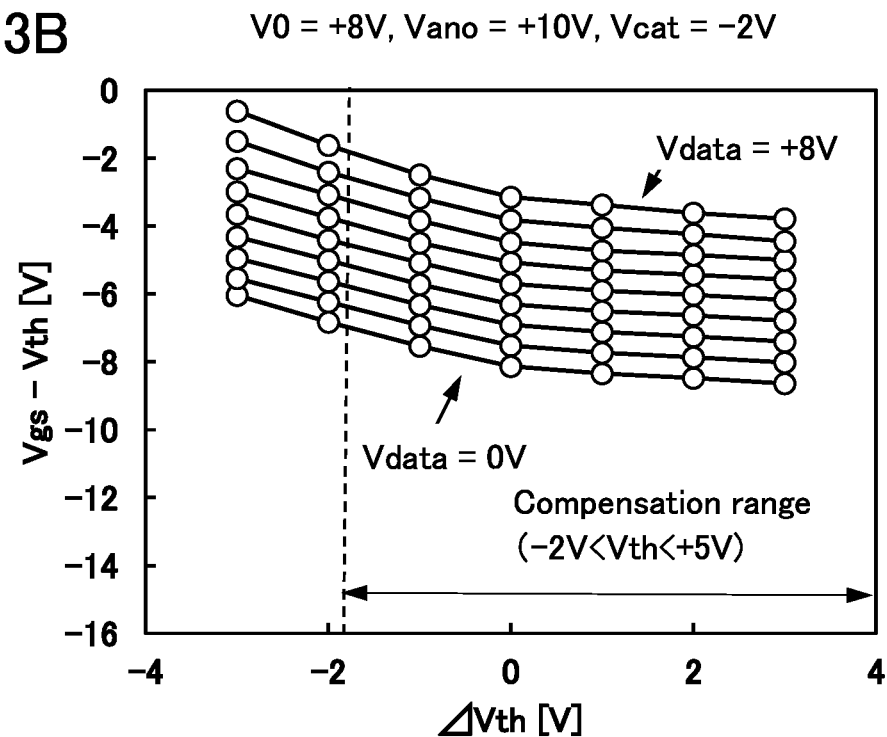

FIG. 13B shows simulation results of the operation with Vth compensation at V0=+8 V. In a theoretical compensation range (−2 V<Vth<+5 V), a slope was smaller than that in the operation without Vth compensation. This indicates the effect of the Vth compensation. Note that on a ΔVth negative side, the slope was slightly larger because Vgs (a difference between V0 and Vano) was small from the beginning of the operation and adequate discharging was not performed for a certain period.

Figure 14A:
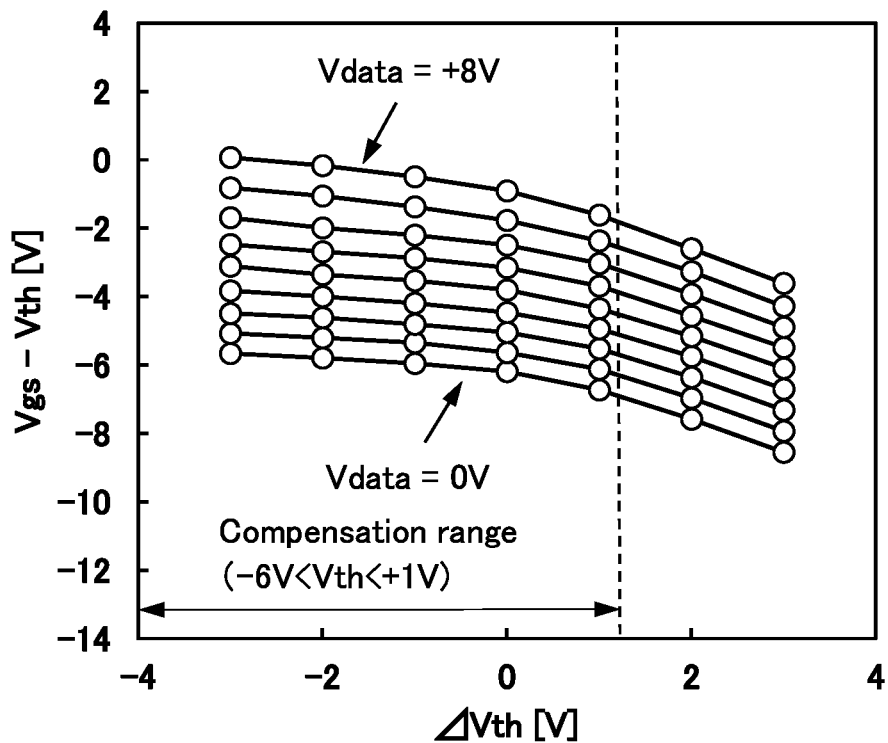
FIG. 14A and FIG. 14B are diagrams showing simulation results.

FIG. 14A shows simulation results when Vth compensation is performed at V0=+4 V so that Vgs is increased. Under this condition, in a theoretical compensation range (−6 V<Vth<+1 V), the slope can be small even when ΔVth is on a negative side. Note that a factor for a slightly large slope on a ΔVth positive side is considered to be a decrease in the discharging amount when Vds becomes smaller through the course of the discharging.

Figure 14B:
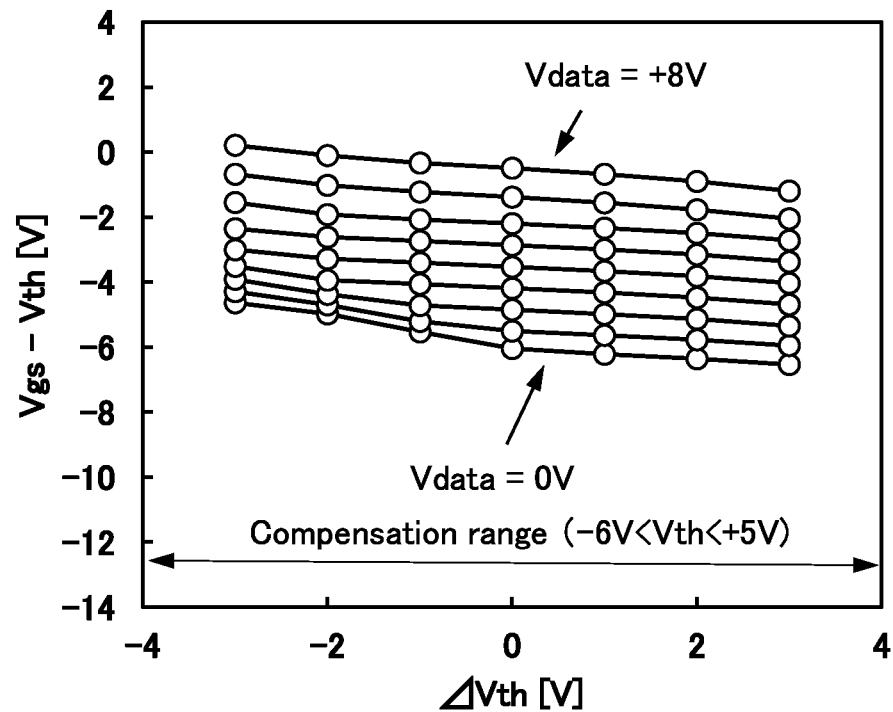

FIG. 14B shows simulation results when Vth compensation is performed at V0=+4 V and Vcat=−6 V so that Vds does not become smaller. It is found that under this condition, in a theoretical compensation range (−6 V<Vth<+5 V), favorable compensation results are obtained.

The above simulation results were able to confirm the effect of one embodiment of the present invention.

This embodiment can be implemented in an appropriate combination with the structures described in the other embodiments.

Embodiment 2

In this embodiment, a structure example of a display apparatus using a light-emitting device will be described. Note that the description of the components, operations, and functions of the display apparatus described in Embodiment 1 is omitted in this embodiment.

The pixel 10 described in Embodiment 1 can be employed for the display apparatus described in this embodiment. Note that a scan line driver circuit and a signal line driver circuit to be described below correspond to the gate driver and the source driver, respectively.

Figure 15A:
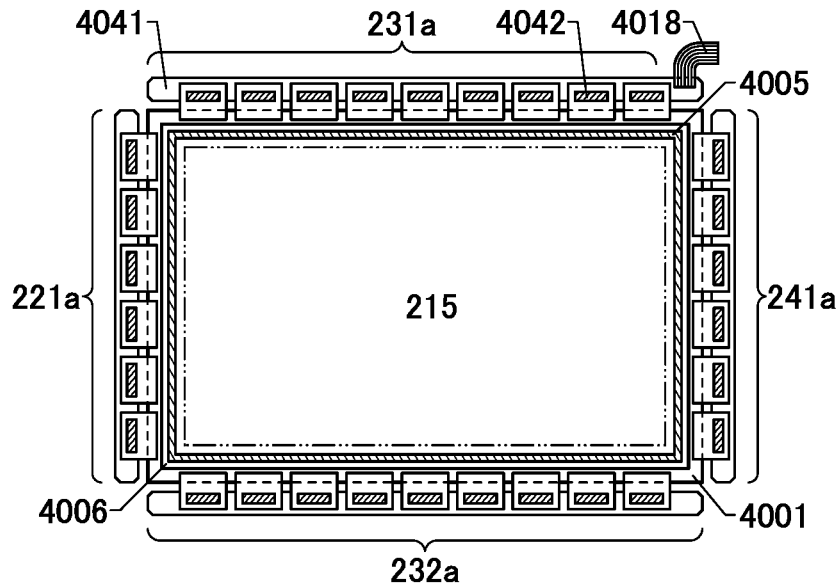
FIG. 15A to FIG. 15C are diagrams each illustrating a display apparatus.
Figure 15B:
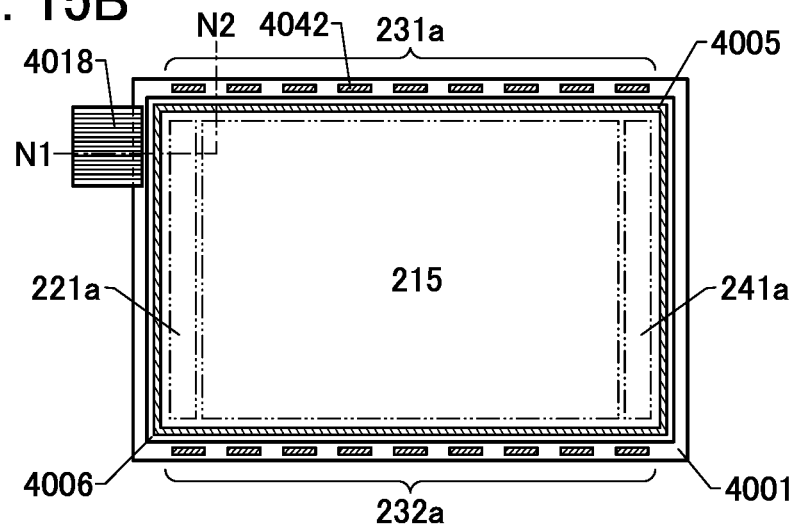
Figure 15C:
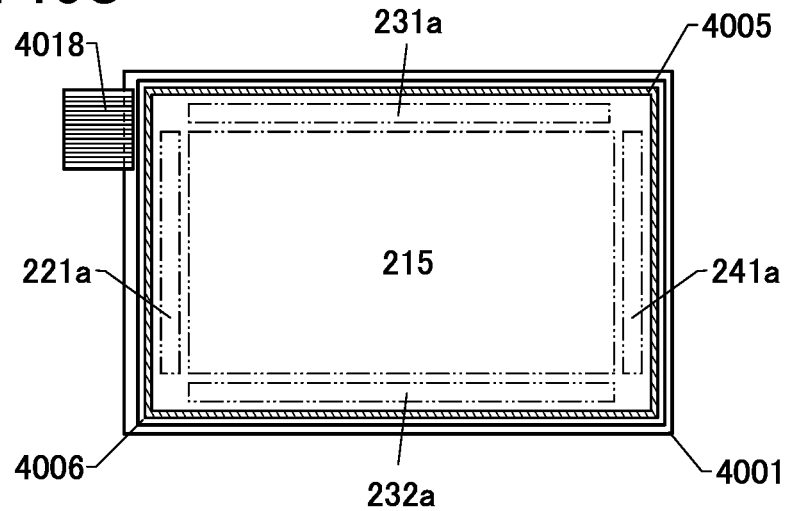

FIG. 15A to FIG. 15C are diagrams each illustrating a structure of a display apparatus in which one embodiment of the present invention can be used.

In FIG. 15A, a sealant 4005 is provided to surround a display portion 215 provided over a first substrate 4001, and the display portion 215 is sealed with the sealant 4005 and a second substrate 4006.

In FIG. 15A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 122, 127, 128, 129, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF (Chip On Film) method, a COG (Chip On Glass) method, a TCP (Tape Carrier Package) method, or the like can be used.

FIG. 15B illustrates an example in which the integrated circuits 4042 included in the signal line driver circuit 231a and the signal line driver circuit 232a are mounted by a COG method. In addition, some or all of the driver circuits can be formed over the same substrate as the display portion 215, so that a system-on-panel can be formed.

In the example illustrated in FIG. 15B, the scan line driver circuit 221a and the common line driver circuit 241a are formed over the same substrate as the display portion 215. When the driver circuits are formed concurrently with pixel circuits in the display portion 215, the number of components can be reduced. Accordingly, productivity can be increased.

In addition, in FIG. 15B, the sealant 4005 is provided to surround the display portion 215, the scan line driver circuit 221a, and the common line driver circuit 241a that are provided over the first substrate 4001. Furthermore, the second substrate 4006 is provided over the display portion 215, the scan line driver circuit 221a, and the common line driver circuit 241a. Consequently, the display portion 215, the scan line driver circuit 221a, and the common line driver circuit 241a are sealed together with the display apparatus by the first substrate 4001, the sealant 4005, and the second substrate 4006.

In addition, although the signal line driver circuit 231a and the signal line driver circuit 232a are separately formed and mounted on the first substrate 4001 in the example illustrated in FIG. 15B, one embodiment of the present invention is not limited to this structure. The scan line driver circuit may be separately formed and then mounted, or part of the signal line driver circuit or part of the scan line driver circuit may be separately formed and then mounted. Alternatively, the signal line driver circuit 231*a* and the signal line driver circuit 232*a* may be formed over the same substrate as the display portion 215, as illustrated in FIG. 15C.

In some cases, the display apparatus includes a panel in which a display device is sealed, and a module in which an IC or the like including a controller is mounted on the panel.

In addition, the display portion and the scan line driver circuit provided over the first substrate each include a plurality of transistors. The Si transistor or the OS transistor described in Embodiment 1 can be applied to each of the transistors.

Transistors included in peripheral driver circuits and transistors included in the pixel circuits of the display portion may have either the same structure or different structures. The transistors included in the peripheral driver circuits may be transistors having the same structure, or transistors having two or more kinds of structures may be included. Similarly, the transistors included in the pixel circuits may be transistors having the same structure, or transistors having two or more kinds of structures may be included.

In addition, an input device 4200 to be described later (see FIG. 16B) can be provided over the second substrate 4006 as an example. A structure where the display apparatus illustrated in FIG. 15A to FIG. 15C is provided with the input device 4200 can function as a touch panel.

There is no particular limitation on a sensor device (also referred to as a sensor element) included in a touch panel according to one embodiment of the present invention. A variety of sensors capable of sensing approach or contact of a sensing target such as a finger or a stylus can be applied to the sensor device.

For example, a variety of types such as a capacitive type, a resistive type, a surface acoustic wave type, an infrared type, an optical type, and a pressure-sensitive type can be used as the sensor type.

In this embodiment, a touch panel including a capacitive sensor device will be described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel according to one embodiment of the present invention can employ a variety of structures, including a structure in which a display apparatus and a sensor device that are separately formed are attached to each other and a structure in which an electrode and the like included in a sensor device are provided on one or both of a substrate supporting a display apparatus and a counter substrate.

Figure 16A:
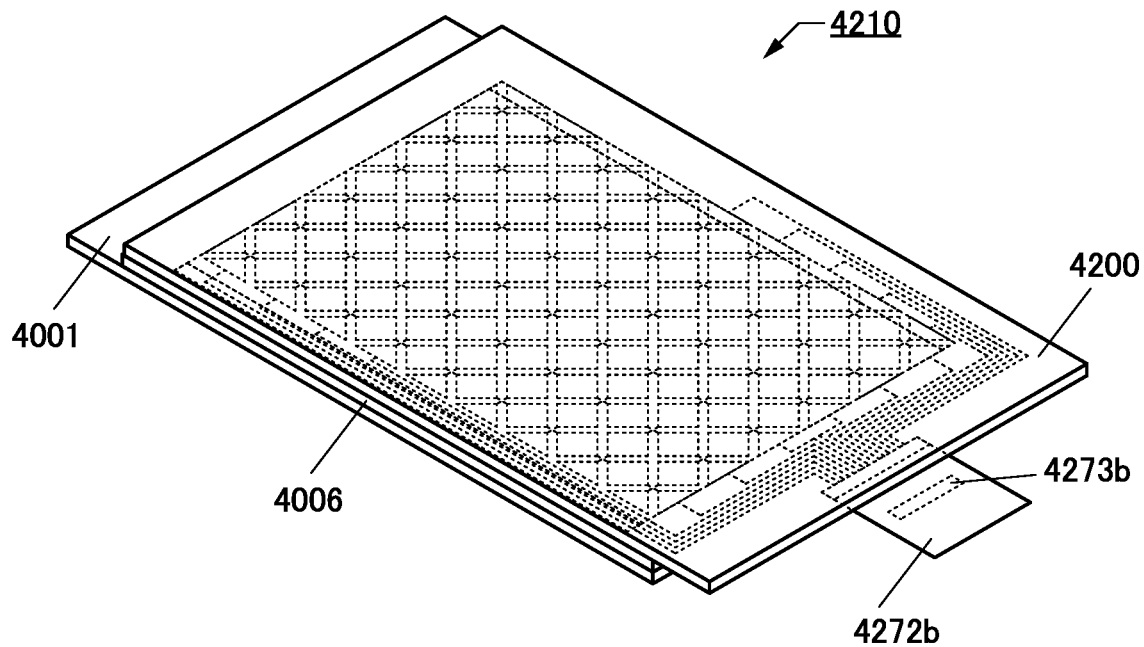
FIG. 16A and FIG. 16B are diagrams illustrating a touch panel.
Figure 16B:
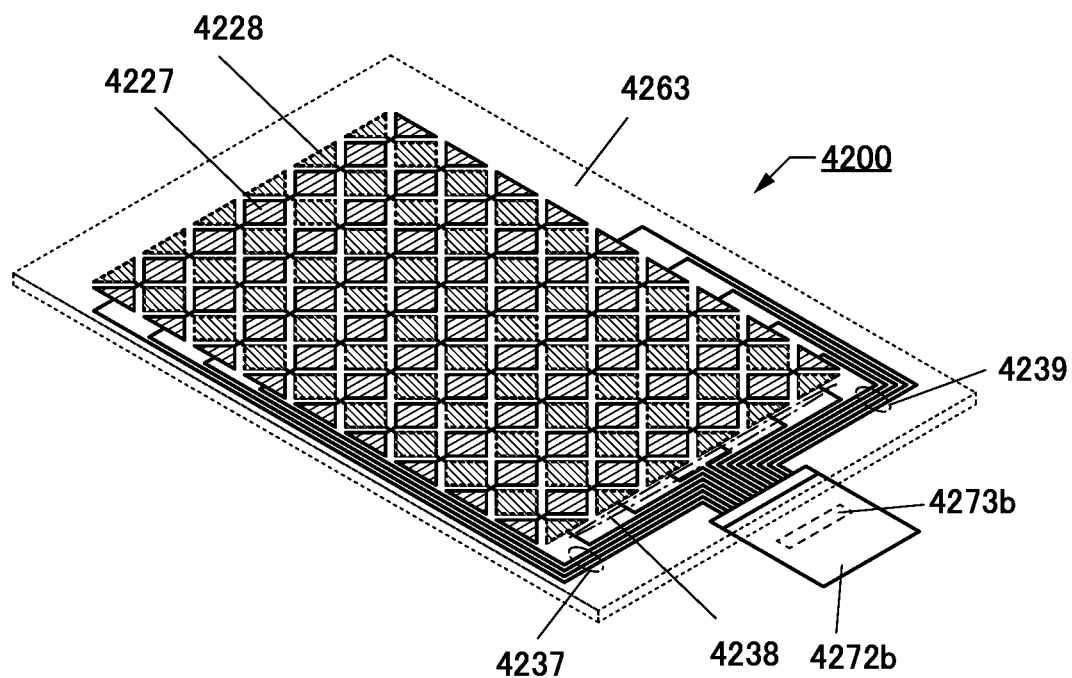

FIG. 16A and FIG. 16B illustrate an example of the touch panel. FIG. 16A is a perspective view of a touch panel 4210. FIG. 16B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus, which are provided to overlap each other.

The input apparatus 4200 includes a substrate 4263, an electrode 4227, an electrode 4228, a plurality of wirings 4237, a plurality of wirings 4238, and a plurality of wirings 4239. The electrode 4227 can be electrically connected to the wiring 4237 or the wiring 4239, for example. In addition, the electrode 4228 can be electrically connected to the wiring 4239. An FPC 4272*b* is electrically connected to each of the plurality of wirings 4237 and the plurality of wirings 4238. An IC 4273*b* can be provided for the FPC 4272*b*.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be employed.

Figure 17:
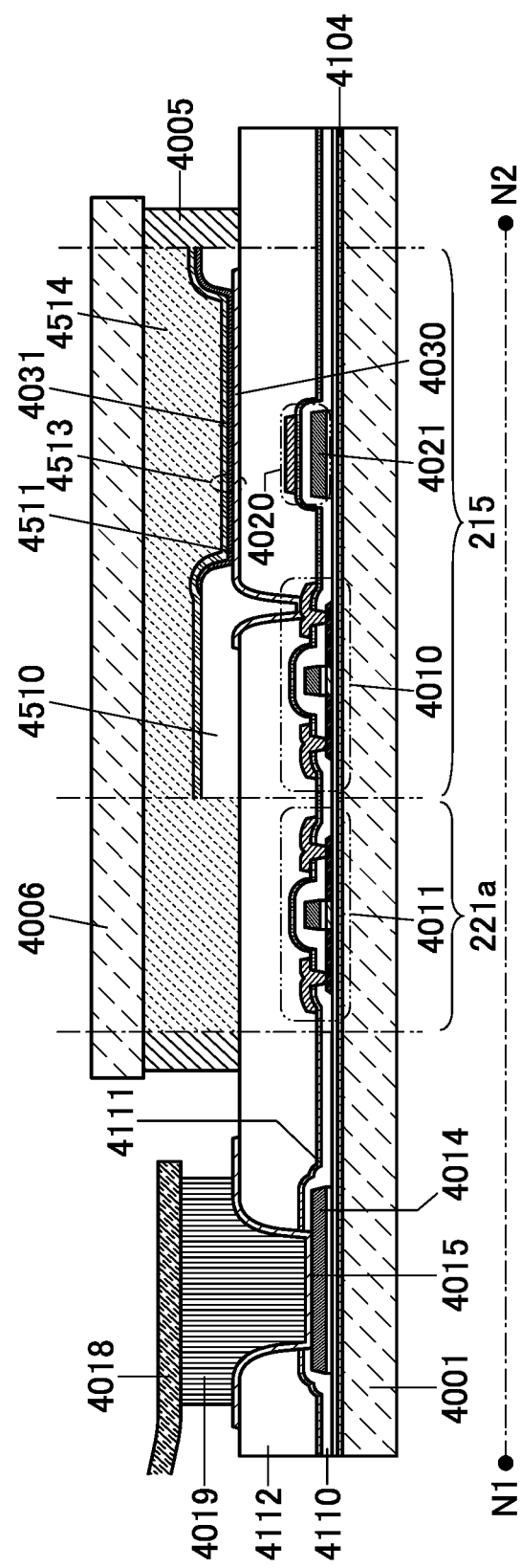
FIG. 17 is a diagram illustrating a display apparatus.

FIG. 17 is a cross-sectional view taken along the chain line N1-N2 in FIG. 16B. FIG. 17 illustrates an example of a display apparatus using a light-emitting device as the display apparatus. The display apparatus includes an electrode 4015, and the electrode 4015 is electrically connected to a terminal included in the FPC 4018 through an anisotropic conductive layer 4019. In addition, in FIG. 17, the electrode 4015 is electrically connected to a wiring 4014 in an opening formed in an insulating layer 4112, an insulating layer 4111, and an insulating layer 4110.

The electrode 4015 is formed using the same conductive layer as a first electrode layer 4030, and the wiring 4014 is formed using the same conductive layer as gate electrodes of a transistor 4010 and a transistor 4011.

The display portion 215 and the scan line driver circuit 221*a* provided over the first substrate 4001 each include a plurality of transistors, and the transistor 4010 included in the display portion 215 and the transistor 4011 included in the scan line driver circuit 221*a* are also illustrated as an example. Note that in the example illustrated in FIG. 17, the transistor 4010 and the transistor 4011 are top-gate transistors but may be bottom-gate transistors.

The insulating layer 4112 is provided over the transistor 4010 and the transistor 4011. In addition, a partition 4510 is formed over the insulating layer 4112.

The partition 4510 is formed using an organic insulating material or an inorganic insulating material. It is particularly preferable that the partition 4510 be formed using a photosensitive resin material to have an opening portion over the first electrode layer 4030 so that a side surface of the opening portion is formed to be an inclined surface with continuous curvature.

The display apparatus further includes a capacitor 4020. An example is illustrated in which The capacitor 4020 includes an electrode 4021 formed in the same step as the gate electrode of the transistor 4010, an insulating layer 4110, an insulating layer 4111, and an electrode formed in the same step as a source electrode and a drain electrode. The capacitor 4020 is not limited to having this structure and may be formed using another conductive layer and another insulating layer.

The display apparatus further includes the insulating layer 4111 and an insulating layer 4104. For the insulating layer 4111 and the insulating layer 4104, insulating layers through which an impurity element does not easily pass are used. A semiconductor layer of the transistor is sandwiched between the insulating layer 4111 and the insulating layer 4104, so that immersion of impurities from the outside can be prevented.

The transistor 4010 provided in the display portion 215 is electrically connected to the display device. As the display device, a light-emitting device can be used. As the light-emitting device, for example, an EL device that utilizes electroluminescence can be employed. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

For the EL device, an organic EL device (also referred to as an organic EL element) or an inorganic EL device (also referred to as an inorganic EL element) can be used, for example. Note that an LED (including a micro LED), which uses a compound semiconductor as a light-emitting material, is an EL element, and can be also used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is sandwiched between dielectric layers, which are further sandwiched between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top-emission structure in which light emission is extracted from a surface on a side opposite to the substrate; a bottom emission structure in which light emission is extracted from a surface on a substrate side; or a dual emission structure in which light emission is extracted from both surfaces.

A black matrix (a light-blocking layer); a coloring layer (a color filter); an optical member (an optical substrate) such as a polarizing member, a retardation member, or an anti-reflection member; or the like may be provided as appropriate if needed.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can be also used for the light-blocking layer. For example, a stacked-layer structure of a film containing a material of a coloring layer that transmits light of a certain color and a film containing a material of a coloring layer that transmits light of another color can be used. Material sharing between the coloring layer and the light-blocking layer is preferable because process simplification as well as equipment sharing can be achieved.

Examples of a material that can be used for the coloring layer include a metal material, a resin material, and a resin material containing a pigment or a dye. The light-blocking layer and the coloring layer can be formed by, for example, an inkjet method or the like.

A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and a second electrode layer 4031; however, this embodiment is not limited to this structure. The structure of the light-emitting device 4513 can be changed as appropriate depending on a direction in which light is extracted from the light-emitting device 4513, or the like.

The light-emitting layer 4511 may be formed using a single layer or may be formed using a plurality of layers stacked.

The emission color of the light-emitting device 4513 can be white, red, green, blue, cyan, magenta, yellow, or the like depending on the material for the light-emitting layer 4511.

As a method for achieving color display, there are a method in which the light-emitting device 4513 that emits white light is combined with a coloring layer and a method in which the light-emitting device 4513 that emits light of a different emission color is provided in each pixel. The former method is more productive than the latter method. In contrast, the latter method, which requires separate formation of the light-emitting layer 4511 pixel by pixel, is less productive than the former method. However, the latter method can provide higher color purity of the emission color than the former method. In addition to the latter method, when the light-emitting device 4513 is provided with a microcavity structure, the color purity can be further increased.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride (the amount of oxygen>the amount of nitrogen), aluminum nitride oxide (the amount of nitrogen>the amount of oxygen), DLC (Diamond Like Carbon), or the like can be used. In addition, in a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. Furthermore, a drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. Furthermore, a drying agent may be contained in the sealant 4005.

In addition, if necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface to reduce the glare can be performed. In addition, when the light-emitting device has a microcavity structure, light with high color purity can be extracted. Furthermore, when a microcavity structure and a color filter are combined, the glare can be reduced and the visibility of a displayed image can be increased.

Whether the first electrode layer and the second electrode layer (also referred to as a pixel electrode layer, a common electrode layer, a counter electrode layer, or the like) for applying voltage to the display device have light-transmitting properties or light-reflecting properties may be determined in accordance with the direction in which light is extracted, a position where the electrode layer is provided, and the pattern structure of the electrode layer. For each of the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

Each of the first electrode layer 4030 and the second electrode layer 4031 can be also formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Figure 18:
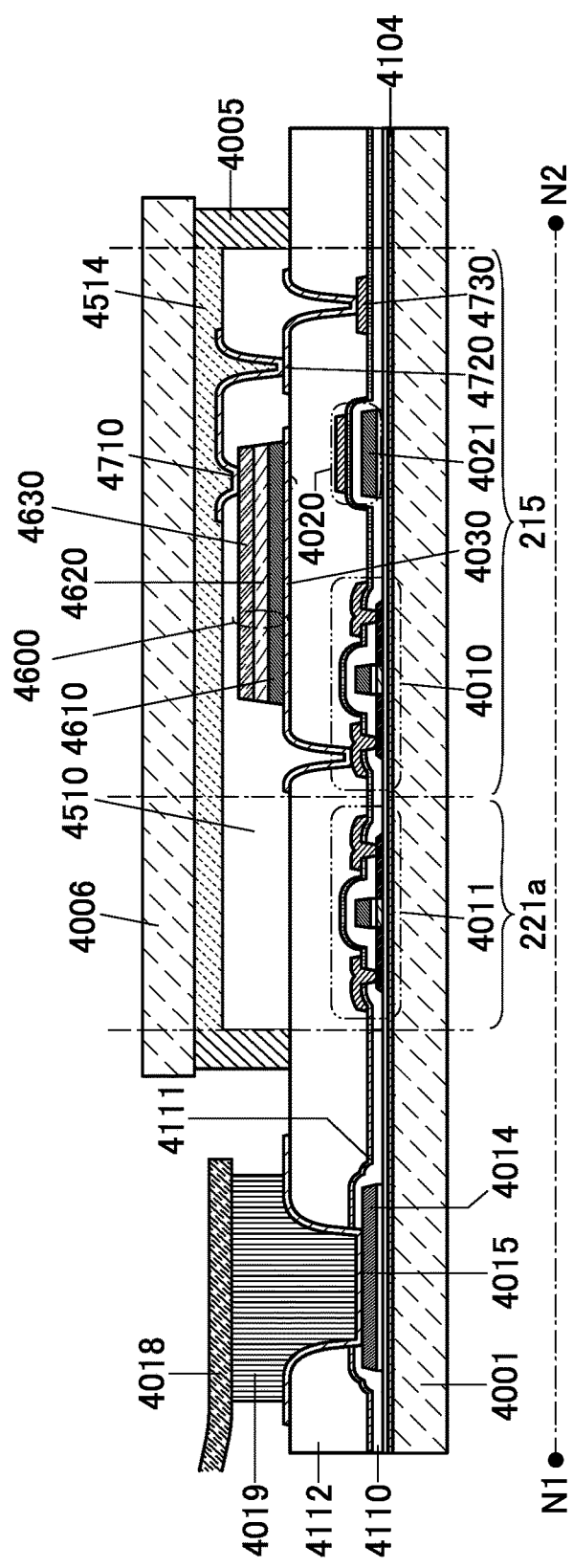
FIG. 18 is a diagram illustrating a display apparatus.

FIG. 18 illustrates an example of a display apparatus using a micro LED as the display device. Note that components that are the same as the components in the structure of FIG. 17 are denoted by the same reference numerals. Note that here, an LED chip whose one side size is larger than 1 mm is called a macro LED, an LED chip whose one side size is larger than 100 μm and smaller than or equal to 1 mm is called a mini LED, and an LED chip whose one side size is smaller than or equal to 100 μm is called a micro LED. A micro LED 4600 includes a semiconductor layer 4610, a light-emitting layer 4620, and a semiconductor layer 4630.

The light-emitting layer 4620 is sandwiched between the semiconductor layer 4610 and the semiconductor layer 4630. In the light-emitting layer 4620, electrons and holes are combined to emit light. A p-type semiconductor layer can be used as the semiconductor layer 4610, and an n-type semiconductor layer can be used as the semiconductor layer 4630. In addition, an n-type semiconductor layer, an i-type semiconductor layer, or a p-type semiconductor layer can be used as the light-emitting layer 4620.

A stacked-layer structure including the semiconductor layer 4610, the light-emitting layer 4620, and the semiconductor layer 4630 is formed to emit red light, green light, blue light, bluish violet light, violet light, ultraviolet light, or the like. For the stacked-layer structure, for example, a compound containing a Group 13 element and a Group 15 element (also referred to as a Group III-V compound) can be used. Examples of the Group 13 element include aluminum, gallium, and indium. Examples of the Group 15 element include nitrogen, phosphorus, arsenic, and antimony.

For example, a pn junction or a pin junction is formed using a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like to form a light-emitting diode emitting target light. Note that a compound other than the above may be also used.

The pn junction or the pin junction may be not only a homojunction but also a heterojunction or a double heterojunction. Alternatively, an LED having a quantum well junction, a nanocolumn LED, or the like may be used.

For example, a material such as gallium nitride can be used for a light-emitting diode emitting light in the ultraviolet wavelength range to the blue wavelength range. A material such as a compound of indium and gallium nitride can be used for a light-emitting diode emitting light in the ultraviolet wavelength range to the green wavelength range. A material such as a compound of aluminum, gallium, indium, and phosphorus or a compound of gallium and arsenic can be used for a light-emitting diode emitting light in the green wavelength range to the red wavelength range. A material such as a compound of gallium and arsenic can be used for a light-emitting diode emitting light in the infrared wavelength range.

With a structure where a plurality of micro LEDs 4600 provided over the same plane can emit light of different colors such as R (red), G (green), and B (blue), for example, a color image can be displayed without using a color conversion layer. Accordingly, a step of forming a color conversion layer is unnecessary, and manufacturing cost of the display apparatus can be reduced.

Alternatively, a structure may be employed in which all micro LEDs 4600 provided over the same plane emit light of the same color. In this case, light emitted from the light-emitting layer 4620 is extracted to the outside of the display apparatus through one or both of a color conversion layer and a coloring layer. Quantum dots can be used for the color conversion layer, for example.

The semiconductor layer 4630 is electrically connected to a wiring layer 4730 through a wiring layer 4710 and a wiring layer 4720. The wiring layer 4730 can supply a cathode potential.

Since the transistor is easily broken by static electricity or the like, a protective circuit for protecting the driver circuit is preferably provided. The protective circuit is preferably formed using a nonlinear element.

This embodiment can be implemented in an appropriate combination with the structures described in the other embodiments.

Embodiment 3

In this embodiment, examples of transistors that can be used as the transistors described in the above embodiments are described with reference to drawings.

The display apparatus according to one embodiment of the present invention can be manufactured using a transistor with various modes, such as a bottom-gate transistor or a top-gate transistor. Therefore, the material of a semiconductor layer and the structure of a transistor can be easily changed depending on the existing production line.

[Bottom-Gate Transistor]

Figure 19A:
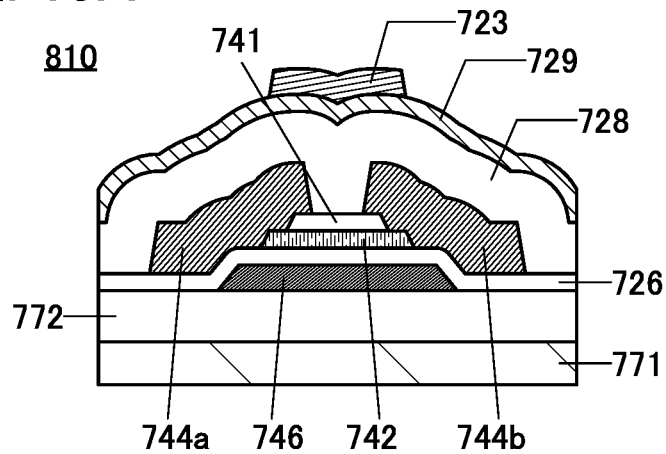
FIG. 19A to FIG. 19C are diagrams illustrating transistors.

FIG. 19A is a cross-sectional view of a channel-protective transistor 810, which is a kind of bottom-gate transistor, in a channel length direction. In FIG. 19A, the transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

In addition, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b.

In addition, the transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. In a region where oxygen vacancies are generated in the semiconductor layer 742, a carrier concentration is increased; thus, the region becomes n-type to be an n-type region (n+ layer). Accordingly, the region can function as a source region or a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

An electrode 723 that can function as a back gate electrode is provided over the insulating layer 729. The electrode 723 can be formed using a material and a method similar to those for the electrode 746. Note that a structure in which the electrode 723 is not provided may be employed.

In general, a back gate electrode is formed using a conductive layer and positioned so that a channel formation region in a semiconductor layer is sandwiched between the gate electrode and the back gate electrode. Thus, the back gate electrode can function in a manner similar to that of the gate electrode. The potential of the back gate electrode may be equal to the potential of the gate electrode or may be a ground potential (GND potential) or a given potential. In addition, when the potential of the back gate electrode is changed without synchronization and independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode," the other is referred to as a "back gate electrode." In the transistor 810, for example, in the case where the electrode 723 is referred to as a "gate electrode," the electrode 746 is referred to as a "back gate electrode." In addition, in the case where the electrode 723 is used as a "gate electrode," the transistor 810 can be regarded as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 sandwiched therebetween and setting the potential of the electrode 746 equal to the potential of the electrode 723, a region of the semiconductor layer 742 through which carriers flow is enlarged in a film thickness direction; thus, the amount of transferred carriers is increased. As a result, the on-state current of the transistor 810 is increased and the field-effect mobility is increased.

Therefore, the transistor 810 is a transistor having high on-state current for its occupation area. That is, the occupation area of the transistor 810 can be small for required on-state current.

In addition, the gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer so that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Therefore, photodegradation of the semiconductor layer can be prevented, and degradation in electrical characteristics of the transistor, such as a shift in the threshold voltage, can be prevented.

Figure 19B:
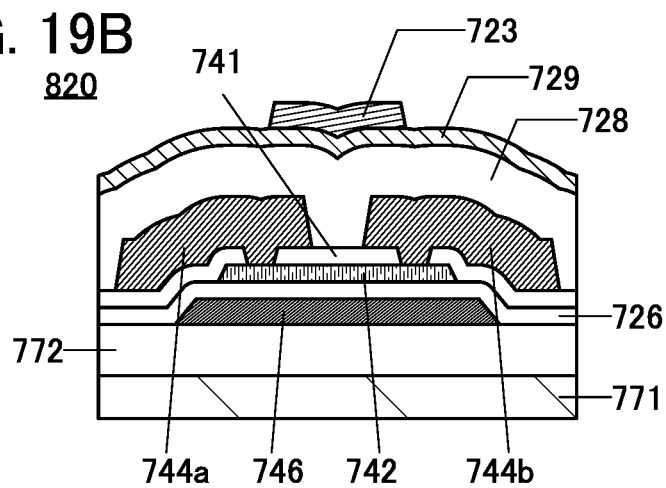

FIG. 19B is a cross-sectional view of a channel-protective transistor 820, which has a structure different from FIG. 19A, in a channel length direction. The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744a through an opening portion formed by selectively removing part of the insulating layer 741 that overlaps the semiconductor layer 742. Furthermore, the semiconductor layer 742 is electrically connected to the electrode 744b through another opening portion formed by selectively removing part of the insulating layer 741 that overlaps the semiconductor layer 742. A region of the insulating layer 741 that overlaps the channel formation region can function as a channel protective layer.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

Furthermore, the distance between the electrode 744a and the electrode 746 and the distance between the electrode 744b and the electrode 746 are longer in the transistor 820 than in the transistor 810. Thus, parasitic capacitance generated between the electrode 744a and the electrode 746 can be reduced. Moreover, parasitic capacitance generated between the electrode 744b and the electrode 746 can be reduced.

Figure 19C:
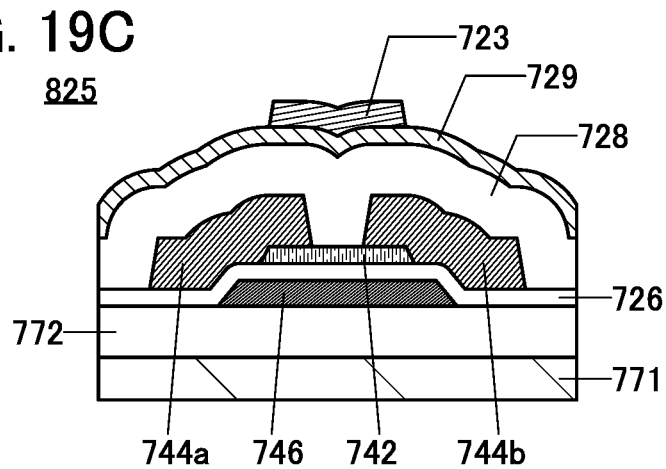

FIG. 19C is a cross-sectional view of a channel-etched transistor 825, which is a kind of bottom-gate transistor, in a channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

[Top-Gate Transistor]

Figure 20A:
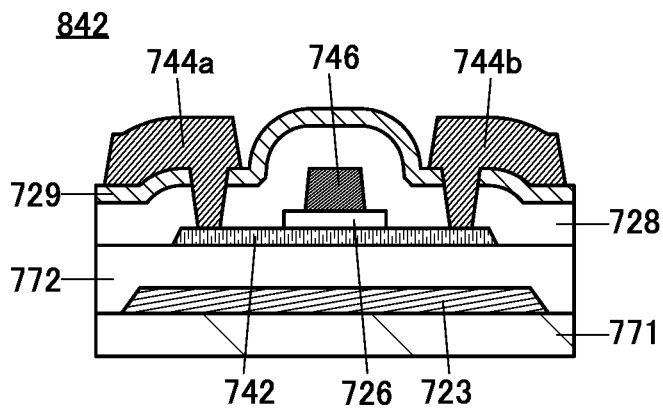
FIG. 20A to FIG. 20C are diagrams illustrating transistors.

A transistor 842 illustrated in FIG. 20A is a kind of top-gate transistor. The electrode 744a and the electrode 744b are electrically connected to the semiconductor layer 742 through opening portions formed in the insulating layer 728 and the insulating layer 729. In addition, part of the insulating layer 726 that does not overlap the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 that overlaps the insulating layer 726 but does not overlap the electrode 746.

In addition, the transistor 842 includes the electrode 723 that is formed over the substrate 771. The electrode 723 includes a region overlapping the semiconductor layer 742 with the insulating layer 772 therebetween. The electrode 723 can function as a back gate electrode. Note that a structure in which the electrode 723 is not provided may be employed.

Figure 20B:
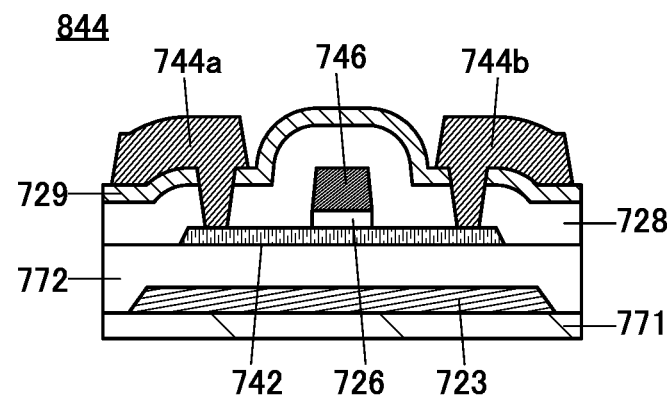
Figure 20C:
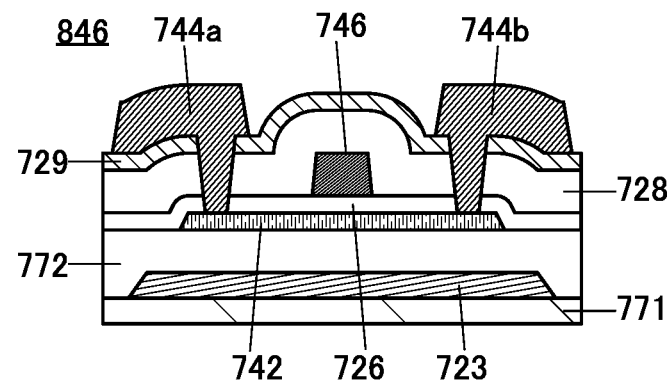

Furthermore, as in a transistor 844 illustrated in FIG. 20B, the insulating layer 726 in a region that does not overlap the electrode 746 may be completely removed. Alternatively, the insulating layer 726 may be left as in a transistor 846 illustrated in FIG. 20C.

Figure 21A:
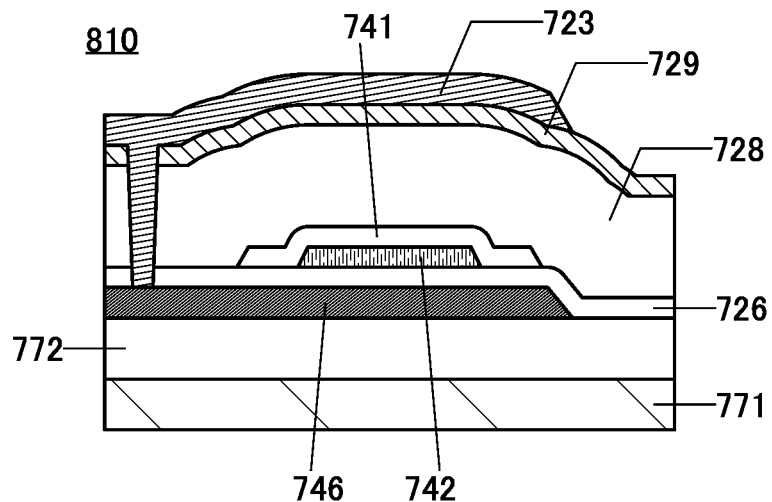
FIG. 21A and FIG. 21B are diagrams illustrating the transistors.
Figure 21B:
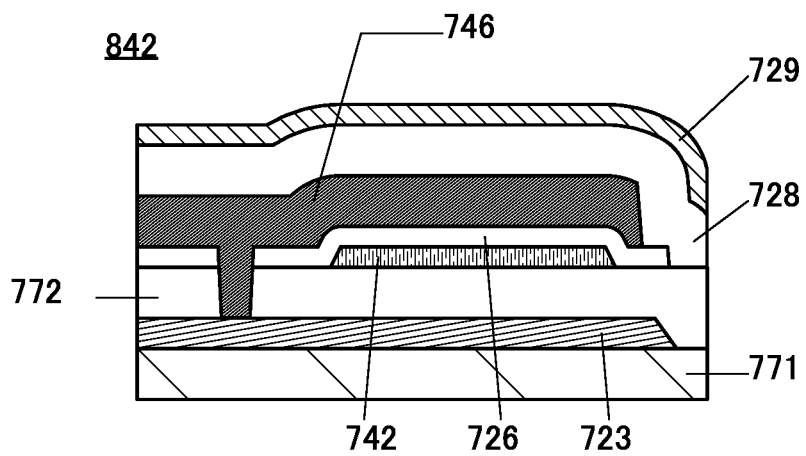

FIG. 21A illustrates a cross-sectional view of the transistor 810 in a channel width direction, and FIG. 21B illustrates a cross-sectional view of the transistor 842 in a channel width direction.

In each of the structures illustrated in FIG. 21A and FIG. 21B, the gate electrode is connected to the back gate electrode, and the potentials of the gate electrode and the back gate electrode are equal to each other. In addition, the semiconductor layer 742 is sandwiched between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode or the back gate electrode with insulating layers sandwiched therebetween.

This structure enables the semiconductor layer 742 included in the transistor to be electrically surrounded by electric fields of the gate electrode and the back gate electrode.

A transistor device structure in which the semiconductor layer 742 where the channel formation region is formed is electrically surrounded by electric fields of the gate electrode and the back gate electrode in this manner can be referred to as a Surrounded channel (S-channel) structure.

With the S-channel structure, an electric field for inducing a channel can be effectively applied to the semiconductor layer 742 by one or both of the gate electrode and the back gate electrode, which enables the transistor to have an improved current drive capability and high on-state current characteristics. In addition, the transistor can be miniaturized because the on-state current can be increased. The S-channel structure can also increase the mechanical strength of the transistor.

Note that a structure where the gate electrode and the back gate electrode are not connected to each other and are supplied with different potentials may be employed. For example, supplying a constant potential to the back gate electrode can control the threshold voltage of the transistor.

This embodiment can be implemented in an appropriate combination with the structures described in the other embodiments.

Embodiment 4

Examples of an electronic device that can use the display apparatus according to one embodiment of the present invention include display devices, personal computers, image memory devices or image reproducing devices provided with storage media, cellular phones, game machines including portable game machines, portable data terminals, e-book readers, cameras such as video cameras and digital cameras, goggle-type displays (head mounted displays), navigation systems, audio reproducing devices (car audio players, digital audio players, and the like), copiers, facsimiles, printers, multifunction printers, automated teller machines (ATM), and vending machines. FIG. 22A to FIG. 22F illustrate specific examples of these electronic devices.

Figure 22A:
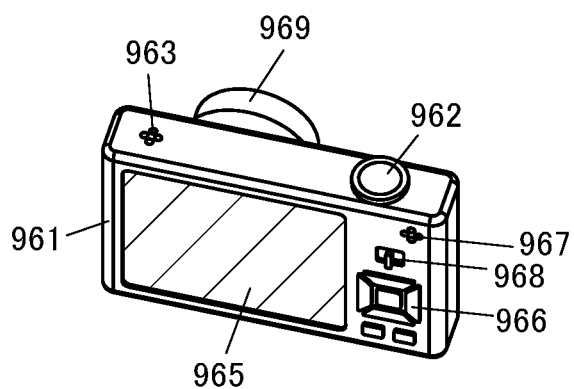
FIG. 22A to FIG. 22F are diagrams illustrating electronic devices.

FIG. 22A illustrates a digital camera, which includes a housing 961, a shutter button 962, a microphone 963, a speaker 967, a display portion 965, operation keys 966, a zoom lever 968, a lens 969, and the like. The display apparatus according to one embodiment of the present invention can be used for the display portion 965.

Figure 22B:
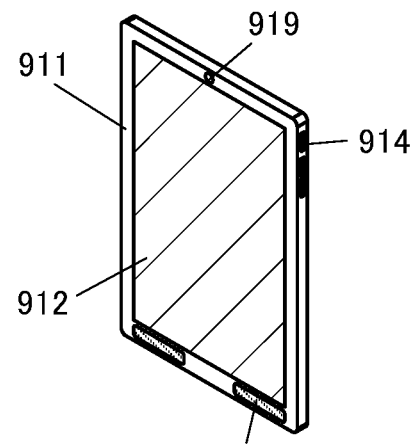

FIG. 22B illustrates a portable data terminal, which includes a housing 911, a display portion 912, speakers 913, an operation button 914, a camera 919, and the like. A touch panel function of the display portion 912 enables input and output of information. The display apparatus according to one embodiment of the present invention can be used for the display portion 912.

Figure 22C:
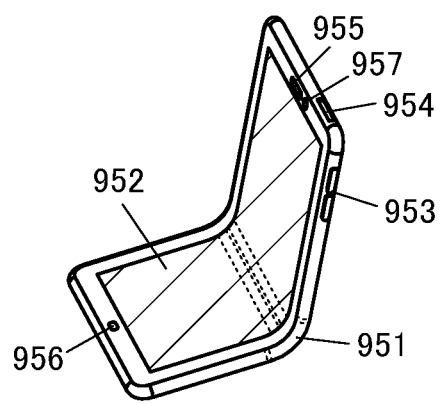

FIG. 22C illustrates a cellular phone, which includes a housing 951, a display portion 952, operation buttons 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. In addition, the housing 951 and the display portion 952 have flexibility and can be used in a bent state as illustrated in the diagram. The display apparatus according to one embodiment of the present invention can be used for the display portion 952.

Figure 22D:
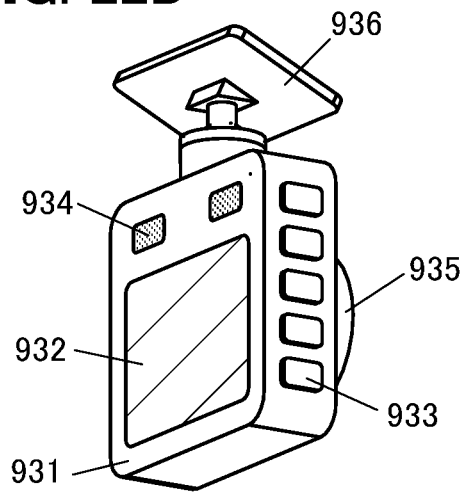

FIG. 22D illustrates a dashboard camera, which includes a housing 931, a display portion 932, operation buttons 933, microphones 934, a lens 935, an attaching member 936, and the like. The dashboard camera is mounted to the windshield or the like of a motor vehicle by the attaching member 936 so that the dashboard camera can record a front view during driving. An image being recorded can be displayed on the display portion 932. The display apparatus according to one embodiment of the present invention can be employed for the display portion 932.

Figure 22E:
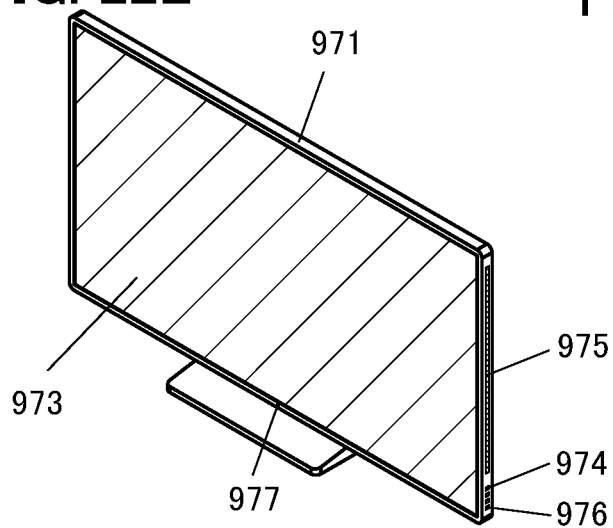

FIG. 22E illustrates a television, which includes a housing 971, a display portion 973, operation buttons 974, speakers 975, a communication connection terminals 976, an optical sensor 977, and the like. The display portion 973 is provided with a touch sensor, and an input operation can be also performed. The display apparatus according to one embodiment of the present invention can be used for the display portion 973.

Figure 22F:
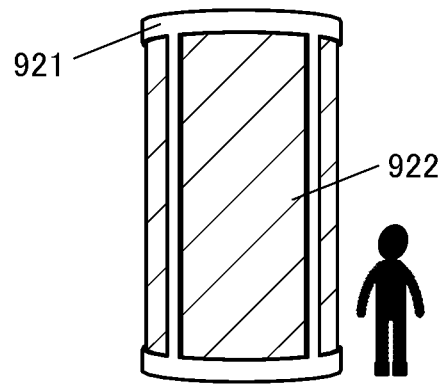

FIG. 22F illustrates digital signage, which has a large display portion 922. The large display portion 922 in the digital signage is attached to a side surface of a pillar 921, for example. The display apparatus according to one embodiment of the present invention can be used for the display portion 922.

This embodiment can be implemented in an appropriate combination with the structures described in the other embodiments.

REFERENCE NUMERALS

SW1: switch, SW2: switch, SW3: switch, SW4: switch, SW5: switch, Tr1: transistor, Tr2: transistor, Tr3: transistor, Tr4: transistor, Tr5: transistor, 10: pixel, 11: pixel array, 20: source driver, 30: gate driver, 101: transistor, 102: transistor, 103: transistor, 104: transistor, 105: transistor, 106: capacitor, 107: transistor, 108: light-emitting device, 121: wiring, 122: wiring, 123: wiring, 124: wiring, 125: wiring, 127: wiring, 128: wiring, 129: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 820: transistor, 825: transistor, 842: transistor, 844: transistor, 846: transistor, 911: housing, 912: display portion, 913: speaker, 914: operation button, 919: camera, 921: pillar, 922: display portion, 931: housing, 932: display portion, 933: operation button, 934: microphone, 935: lens, 936: member, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4005: sealant, 4006: substrate, 4010: transistor, 4011: transistor, 4014: wiring, 4015: electrode, 4018: FPC, 4019: anisotropic conductive layer, 4020: capacitor, 4021: electrode, 4030: electrode layer, 4031: electrode layer, 4041: printed circuit board, 4042: integrated circuit, 4104: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition, 4511: light-emitting layer, 4513: light-emitting device, 4514: filler, 4600: micro LED, 4610: semiconductor layer, 4620: light-emitting layer, 4630: semiconductor layer, 4710: wiring layer, 4720: wiring layer, and 4730: wiring layer.

The invention claimed is:

1. A display apparatus comprising a pixel, the pixel comprising:
   a first transistor;
   a second transistor;
   a third transistor;
   a fourth transistor;
   a fifth transistor;
   a capacitor; and
   a light-emitting device,
   wherein one of a source and a drain of the first transistor is electrically connected to one of a source and a drain of the second transistor and one electrode of the capacitor,
   wherein the other of the source and the drain of the second transistor is electrically connected to one of a source and a drain of the third transistor and a gate of the fourth transistor,
   wherein one of a source and a drain of the fourth transistor is electrically connected to the other electrode of the capacitor and one of a source and a drain of the fifth transistor,
   wherein the other of the source and the drain of the fourth transistor is electrically connected to the light-emitting device,
   wherein a gate of the first transistor and a gate of the third transistor are electrically connected to a first gate line,
   wherein a gate of the fifth transistor is electrically connected to a second gate line, wherein each of the first transistor and the third transistor is an n-channel transistor, wherein the fourth transistor is a p-channel transistor, wherein each of the first transistor and the third transistor comprises a first material in a channel formation region, wherein the fourth transistor comprises a second material in a channel formation region, and wherein the first material is different from the second material.

2. The display apparatus according to claim 1, wherein each of the second transistor and the fifth transistor is a p-channel transistor.

3. The display apparatus according to claim 1, wherein the first material comprises a metal oxide, wherein the metal oxide comprises indium, and wherein the second material comprises silicon.

4. The display apparatus according to according to claim 1, wherein the pixel further comprises a sixth transistor, wherein one of a source and a drain of the sixth transistor is electrically connected to the other of the source and the drain of the fourth transistor, and wherein a gate of the sixth transistor is electrically connected to the first gate line.

5. The display apparatus according to according to claim 1, wherein the light-emitting device comprises an organic EL element or a micro LED.

6. The display apparatus according to according to claim 1, wherein the other of the source and the drain of the first transistor is electrically connected to a first wiring which is a source line, wherein the other of the source and the drain of the third transistor is electrically connected to a second wiring which is configured to supply a constant potential, and wherein the other of the source and the drain of the fifth transistor is electrically connected to a third wiring which is a power supply line.

7. The display apparatus according to according to claim 1, wherein a gate of the second transistor is electrically connected to the first gate line.

8. The display apparatus according to according to claim 1, wherein a gate of the second transistor is electrically connected to a third gate line.

9. The display apparatus according to according to claim 1, wherein each of the first transistor and the third transistor comprises a back gate, wherein the gate of the first transistor is electrically connected to the back gate of the first transistor, and wherein the gate of the third transistor is electrically connected to the back gate of the third transistor.

10. A display apparatus comprising a pixel, the pixel comprising:
a first transistor;
a second transistor;
a third transistor;
a fourth transistor;
a fifth transistor;
a capacitor; and
a light-emitting device, wherein one of a source and a drain of the first transistor is electrically connected to one of a source and a drain of the second transistor and one electrode of the capacitor, wherein the other of the source and the drain of the second transistor is electrically connected to one of a source and a drain of the third transistor and a gate of the fourth transistor, wherein one of a source and a drain of the fourth transistor is electrically connected to the other electrode of the capacitor and one of a source and a drain of the fifth transistor, wherein the other of the source and the drain of the fourth transistor is electrically connected to the light-emitting device, wherein each of the first transistor and the third transistor is an n-channel transistor, wherein the fourth transistor is a p-channel transistor, wherein each of the first transistor and the third transistor comprises a first material in a channel formation region, wherein the fourth transistor comprises a second material in a channel formation region, and wherein the first material is different from the second material.

11. The display apparatus according to claim 10, wherein each of the second transistor and the fifth transistor is a p-channel transistor.

12. The display apparatus according to claim 10, wherein the first material comprises a metal oxide, wherein the metal oxide comprises indium, and wherein the second material comprises silicon.

13. The display apparatus according to according to claim 10, wherein the pixel further comprises a sixth transistor, and wherein one of a source and a drain of the sixth transistor is electrically connected to the other of the source and the drain of the fourth transistor.

14. The display apparatus according to according to claim 10, wherein the light-emitting device comprises an organic EL element or a micro LED.

15. The display apparatus according to according to claim 10, wherein each of the first transistor and the third transistor comprises a back gate, wherein the gate of the first transistor is electrically connected to the back gate of the first transistor, and wherein the gate of the third transistor is electrically connected to the back gate of the third transistor.

* * * * *